United States Patent
Duong et al.

(10) Patent No.: US 9,383,076 B2
(45) Date of Patent: *Jul. 5, 2016

(54) LED HOMOGENIZER

(71) Applicant: Illlumitex, Inc., Austin, TX (US)

(72) Inventors: Dung T. Duong, Bee Cave, TX (US); Nicholas Flynn Jameson, Cedar Park, TX (US)

(73) Assignee: Illumitex, Inc., Austin, TX (US)

( * ) Notice: Subject to any disclaimer, the term of this patent is extended or adjusted under 35 U.S.C. 154(b) by 186 days.

This patent is subject to a terminal disclaimer.

(21) Appl. No.: 14/133,171

(22) Filed: Dec. 18, 2013

(65) Prior Publication Data

US 2014/0104852 A1 Apr. 17, 2014

Related U.S. Application Data

(63) Continuation of application No. 13/243,857, filed on Sep. 23, 2011, now Pat. No. 8,632,216.

(60) Provisional application No. 61/386,050, filed on Sep. 24, 2010, provisional application No. 61/406,503, filed on Oct. 25, 2010, provisional application No. 61/479,661, filed on Apr. 27, 2011, provisional application No. 61/487,511, filed on May 18, 2011.

(51) Int. Cl.
| | |
|---|---|
| *F21V 5/00* | (2015.01) |
| *H01L 33/58* | (2010.01) |
| *G02B 19/00* | (2006.01) |
| *F21K 99/00* | (2016.01) |
| *F21V 13/02* | (2006.01) |

(52) U.S. Cl.
CPC . *F21V 5/008* (2013.01); *F21K 9/50* (2013.01); *F21K 9/54* (2013.01); *F21V 13/02* (2013.01); *G02B 19/0028* (2013.01); *G02B 19/0061* (2013.01); *H01L 33/58* (2013.01)

(58) Field of Classification Search
CPC ..... F21V 5/008; F21V 13/02; G02B 19/0061; G02B 19/0028; F21K 9/50; F21K 9/54
See application file for complete search history.

(56) References Cited

U.S. PATENT DOCUMENTS

| | | | |
|---|---|---|---|
| 5,168,401 | A | 12/1992 | Endriz |
| 5,680,257 | A | 10/1997 | Anderson |
| 5,737,300 | A | 4/1998 | Ota et al. |
| 5,785,404 | A | 7/1998 | Wiese |
| 6,388,819 | B1 | 5/2002 | Leidig |

(Continued)

OTHER PUBLICATIONS

International Search Report and Written Opinion for International Patent Application No. PCT/US2011/052993, mailed Jan. 17, 2012, Patent Cooperation Treaty, 9 pgs.

(Continued)

*Primary Examiner* — Peggy Neils
(74) *Attorney, Agent, or Firm* — Sprinkle IP Law Group

(57) ABSTRACT

One embodiment of an optical system described herein comprises a source including light emitting diode chip and a homogenizer. One embodiment of the homogenizer comprises an entrance face positioned to receive light from the source, the entrance face having a first shape, a body configured to homogenize the received light and an exit face, the exit face parallel to the primary emitting face of the source. The homogenizer can emit light with a half angle that is at least 80% of the half angle of light entering the homogenizer.

22 Claims, 17 Drawing Sheets

(56) References Cited

U.S. PATENT DOCUMENTS

| | | |
|---|---|---|
| 6,397,009 B1 | 5/2002 | Ito et al. |
| 6,746,124 B2 | 6/2004 | Fischer et al. |
| 6,816,449 B2 | 11/2004 | Yoo et al. |
| 6,819,505 B1 | 11/2004 | Cassarly et al. |
| 7,077,525 B2 | 7/2006 | Fischer et al. |
| 7,295,379 B2 | 11/2007 | Tsai |
| 8,152,317 B2 | 4/2012 | Okamoto et al. |
| 8,351,122 B2 | 1/2013 | Teijido et al. |
| 8,403,527 B2 | 3/2013 | Brukilacchio |
| 8,632,216 B2 | 1/2014 | Duong et al. |
| 8,899,792 B2 | 12/2014 | Duong et al. |
| 2005/0007767 A1 | 1/2005 | Fischer et al. |
| 2005/0073849 A1 | 4/2005 | Rhoads et al. |
| 2006/0044523 A1 | 3/2006 | Teijido et al. |
| 2007/0012934 A1 | 1/2007 | Abu-Ageel |
| 2007/0045640 A1* | 3/2007 | Erchak .................. B82Y 20/00 257/98 |
| 2007/0133200 A1 | 6/2007 | Uke et al. |
| 2007/0152230 A1 | 7/2007 | Duong et al. |
| 2007/0215891 A1 | 9/2007 | Dahl et al. |
| 2007/0274068 A1 | 11/2007 | Berben et al. |
| 2008/0030974 A1 | 2/2008 | Abu-Ageel |
| 2009/0201677 A1 | 8/2009 | Hoelen et al. |
| 2009/0315051 A1 | 12/2009 | Wu et al. |
| 2010/0284201 A1* | 11/2010 | Alasaarela ........... G02B 6/0008 362/551 |
| 2011/0128742 A9 | 6/2011 | Yuen et al. |
| 2012/0106191 A1 | 5/2012 | Duong et al. |
| 2012/0120662 A1 | 5/2012 | Duong et al. |
| 2015/0131261 A1 | 5/2015 | Duong et al. |

OTHER PUBLICATIONS

International Search Report and Written Opinion for International Patent Application No. PCT/US2011/053085, mailed Jan. 20, 2012, Patent Cooperation Treaty, 8 pgs.

Office Action for U.S. Appl. No. 13/243,052, mailed Feb. 27, 2013, 22 pgs.

Office Action for U.S. Appl. No. 13/243,857, mailed Apr. 5, 2013, 10 pgs.

International Preliminary Report on Patentability for PCT Application No. PCT/US2011/052993, mailed Apr. 4, 2013, 8 pgs.

International Preliminary Report on Patentability for PCT Application No. PCT/US2011/053085, mailed Apr. 4, 2013, 7 pgs.

Notice of Allowance for U.S. Appl. No. 13/243,857, mailed Sep. 16, 2013, 6 pgs.

Notice of Allowance for U.S. Appl. No. 13/243,052, mailed Jul. 21, 2014, 4 pgs.

* cited by examiner

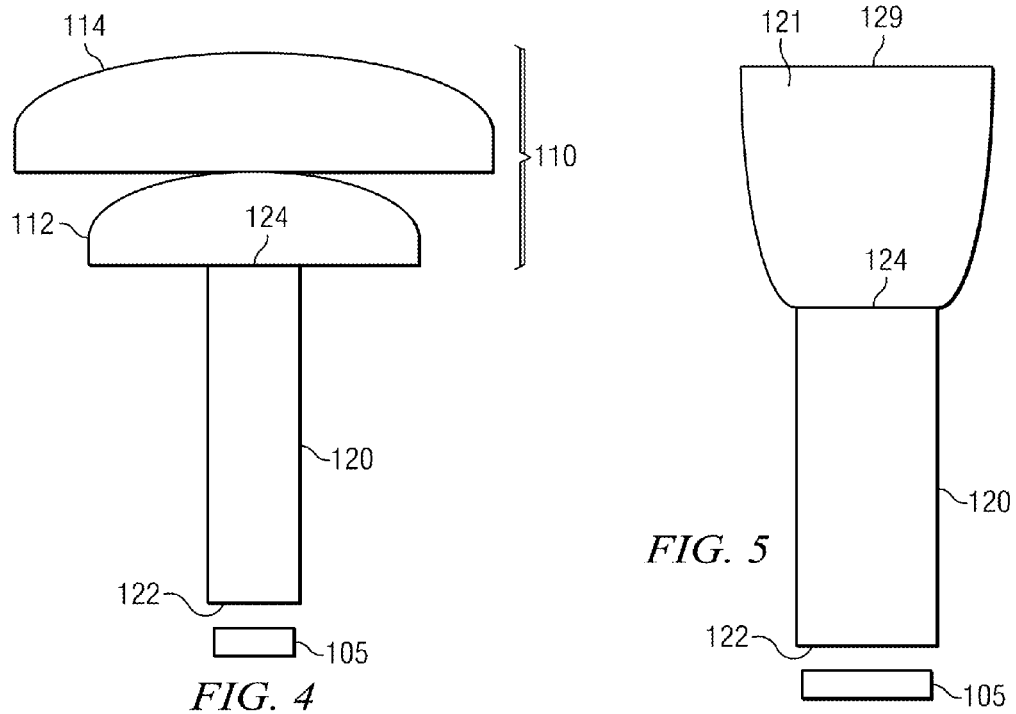
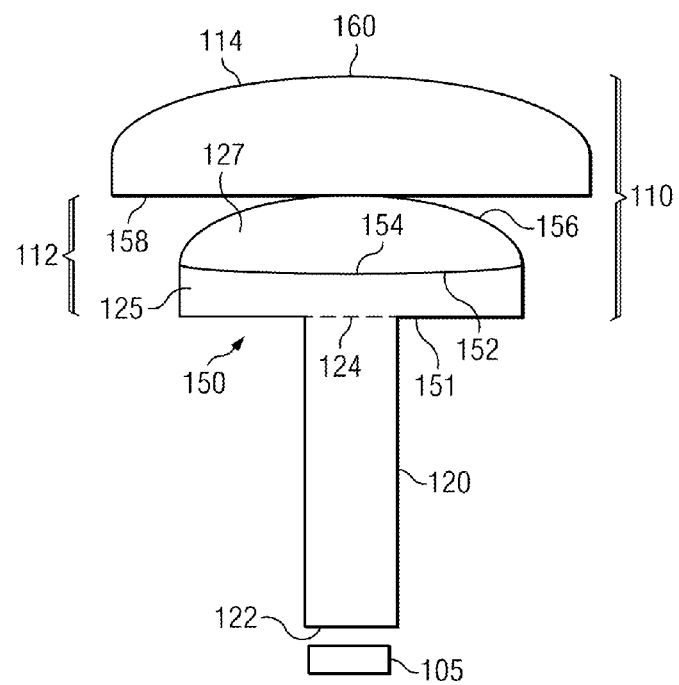

LED HOMOGENIZER

RELATED APPLICATIONS

This application is a continuation of, and claims a benefit of priority under 35 U.S.C. §120 of the filing date of U.S. patent application Ser. No. 13/243,857, entitled "LED Homogenizer" by Duong et al., filed Sep. 23, 2011, which claims the benefit of priority under 35 U.S.C. §119(e) to U.S. Provisional Patent Application No. 61/386,050, entitled "High NA Refractive LED Secondary Optic," by Duong, filed Sep. 24, 2010, U.S. Provisional Patent Application No. 61/406,503, entitled "High NA Refractive LED Secondary Optic," to Duong, filed Oct. 25, 2010, and U.S. Provisional Patent Application No. 61/479,661, entitled "High NA Refractive LED Secondary Optic," to Duong et al., filed Apr. 27, 2011, and U.S. Provisional Patent Application No. 61/487,511, entitled "LED Homogenizer" by Duong, filed May 18, 2011, each of which is fully incorporated by reference herein.

TECHNICAL FIELD

Embodiments described herein are related to optics for homogenizing light within an optical signal. More particularly, embodiments described herein are related to various ways of attaining desired spatial homogenization from one or more light sources.

BACKGROUND

Light emitting diodes (LEDs) are inherently not spatially uniform. The non-uniformity may come from non-radiative metal contacts, uneven phosphor distribution, or the use of multiple LEDs emitting the same or different colors in one optical system. For broad beam angles, spatial variation at illuminated plane may be tolerated. As the beam angle is decreased, spatial non-uniformities become much more distinguishable.

In the conventional art, secondary optics may include one or multiple LEDs of the same or different colors. If the secondary optics projects the source intensity onto a surface, spatial separations of the source create spatial separation at the illuminated plane. LEDs of different colors illuminate a given plane including chromatic spatial separation. One LED with spatial non-uniformities may project spatial non-uniformities to the illuminated plane.

Homogenizers have been used in projection systems. However, the homogenizers were often remote from the light source and included lenses upstream of the homogenizer to focus light into the homogenizer. In a DLP system, the ultra-high performance (UHP) source is imaged into the entrance of the light bar.

There remains a need however to achieve uniform spatial homogenization from one or multiple LEDs for narrow beam angles.

SUMMARY

Embodiments disclosed herein demonstrate multiple ways of attaining spatial homogenization from one or more LED sources. In some embodiments, such homogenization may be achieved while maintaining system radiance. In some embodiments, tradeoffs may be made with respect to system efficacy vs. system radiance. In some embodiments, an LED homogenizer disclosed herein may be an extension of High NA secondary optics. Examples of High NA Refractive LED secondary optics are disclosed in U.S. Provisional Patent Application No. 61/386,050, filed Sep. 24, 2010, No. 61/406,503, filed Oct. 25, 2010, and No. 61/479,661, filed Apr. 27, 2011, all of which are hereby incorporated by reference in their entireties. In some embodiments, an LED homogenizer disclosed herein may be coupled to non-High NA optical systems.

In designing an optical system, it may be advantageous to control the spatial homogenization of light projected towards a plane. Embodiments described herein describe an LED homogenization system to create spatial uniformity at an exit aperture. One embodiment of an optical system described herein includes a source having a primary emitting face, the source comprising at least one LED chip. The optical system also comprises a homogenizer, the homogenizer comprising an entrance face parallel to the primary emitting face of the source and positioned to receive light from the source, the entrance face having a first shape, a body configured to homogenize light by reflecting the received light a plurality of times off sidewalls of the body and an exit face configured to emit light, the exit face parallel to the primary emitting face of the source, wherein the homogenizer is configured to emit light from the exit face that has a half angle that is at least 80% of the half angle of light entering the homogenizer.

Another embodiment of an optical system described herein comprises an LED chip and a homogenizer axially aligned with a primary emitting face of the LED chip. The homogenizer comprises an entrance face positioned to receive light from the light emitting diode, the entrance face having a first shape, and a body configured to homogenize light by reflecting the received light a plurality of times off sidewalls of the body. The homogenizer further comprises an exit face configured to emit light, the exit face parallel to the primary emitting face of the LED chip. The homogenizer is configured to emit light from the exit face that has a half angle that it at least 80% of the half angle of light entering the homogenizer.

According to one embodiment, the exit face has at least a minimum area necessary to conserve radiance. For example, the exit face can have an area at least equal to $$\frac{n^2 A \Omega}{n'^2 \Omega'}$$

wherein $\Omega$ is the effective solid angle in which light enters the homogenizer, $\Omega'$ is the effective solid angle whereby light leaves the homogenizer, A is the area of the entrance face, n is the refractive index of the medium from which light is received by the homogenizer, n' is the refractive index of material into which the homogenizer emits. In a more specific example, the exit face has an area at least equal to $$\frac{n^2 A \pi}{n'^2 \Omega'}$$

wherein $\Omega'$ is the effective solid angle whereby light leaves the homogenizer, A is the area of the entrance face, n is the refractive index of the medium from which light is received by the homogenizer, n' is the refractive index of material into which the homogenizer emits.

According to one embodiment, the homogenizer is separated from the light source by an air gap. In another embodiment an encapsulant with a higher index of refraction than air surrounds the LED chip. The entrance face of the homogenizer contacts the encapsulant. For example, the encapsulant can have approximately the same index of refraction as the homogenizer and/or a lens optically coupled to the homogenizer.

The homogenizer can act to shape light into a desired shape, including geometric and arbitrary shapes. For example, the entrance face of the homogenizer can have a first shape and the exit face can have a second shape different than the first shape. The homogenizer can include a set of transition features to transition from the first shape to the second shape. The body of the homogenizer may be tapered between the entrance face and exit face and can include a set of facets transitioning to the exit face having the second shape.

In addition to the LED and homogenizer, an embodiment of a light distribution system can include a series of lenses optically coupled to the exit face of the homogenizer. The lenses in the series can be configured, in combination, to successively reduce a beam angle of light from a first beam angle to an emission beam. In another embodiment, the light distribution system comprises an optical device optically coupled to the exit face of the homogenizer, the optical device configured to emit at least 70% of the light entering the optical device from the homogenizer in a controlled beam angle.

Another embodiment described herein can include a method of homogenizing light comprising i) receiving light at an entrance face of a homogenizer from an LED chip, the entrance face having a first shape and arranged parallel to the primary emitting surface of the LED chip and the homogenizer axially aligned with the LED chip; ii) homogenizing the received light within the homogenizer; and iii) emitting the homogenized light at an exit face parallel to the primary emitting surface of the LED chip. Homogenizing light can include reflecting the light a plurality of times off sidewalls of the body of the optical element. The method can further include emitting light in a second shape different than the first shape. One embodiment of the method may also include emitting the homogenized light into a series of lenses that are configured, in combination, to successively reduce a beam angle of light from a first beam angle to an emission beam angle and emit in the emission beam angle at least 70% of the light entering the series of lenses from the homogenizer. Another embodiment of the method can include emitting the homogenized light into an optical device optically coupled to the exit face of the homogenizer, the optical device configured to emit at least 70% of the light entering the optical device from the homogenizer in a controlled beam angle.

According to example embodiments, systems and methods for homogenizing light are provided for. A method for homogenizing light may include receiving light at an entrance face, the entrance face having a first shape. The received light may then be homogenized within a body of an optical element and emitted at an exit face of the body of the optical element. In the example embodiment, the exit face may have a second shape, and the first shape may have different geometric characteristics than the second shape. Additionally, the second shape has a greater surface area than the first shape. Furthermore, the entrance face may be configured to receive light from a light emitting diode, and the exit face may be coupled to at least one lens.

BRIEF DESCRIPTION OF THE FIGURES

A more complete understanding of various embodiments of optical systems and devices and the advantages thereof may be acquired by referring to the following description, taken in conjunction with the accompanying drawings in which like reference numbers indicate like features and wherein:

FIG. 4 is a diagrammatic representation of yet another embodiment of an optical system;

FIG. 5 is a diagrammatic representation of yet another embodiment of an optical system;

FIG. 6 is a diagrammatic representation of yet another embodiment of an optical system;

DETAILED DESCRIPTION

The disclosure and various features and advantageous details thereof are explained more fully with reference to the exemplary, and therefore non-limiting, embodiments illustrated in the accompanying drawings and detailed in the following description. Descriptions of known starting materials and processes may be omitted so as not to unnecessarily obscure the disclosure in detail. It should be understood, however, that the detailed description and the specific examples, while indicating the preferred embodiments, are given by way of illustration only and not by way of limitation. Various substitutions, modifications, additions and/or rearrangements within the spirit and/or scope of the underlying inventive concept will become apparent to those skilled in the art from this disclosure.

As used herein, the terms "comprises," "comprising," "includes," "including," "has," "having" or any other variation thereof, are intended to cover a non-exclusive inclusion. For example, a process, product, article, or apparatus that comprises a list of elements is not necessarily limited to only those elements but may include other elements not expressly listed or inherent to such process, product, article, or apparatus. Further, unless expressly stated to the contrary, "or" refers to an inclusive "or" and not to an exclusive "or". For example, a condition A or B is satisfied by any one of the following: A is true (or present) and B is false (or not present), A is false (or not present) and B is true (or present), and both A and B are true (or present).

Additionally, any examples or illustrations given herein are not to be regarded in any way as restrictions on, limits to, or express definitions of, any term or terms with which they are utilized. Instead these examples or illustrations are to be regarded as being described with respect to one particular embodiment and as illustrative only. Those of ordinary skill in the art will appreciate that any term or terms with which these examples or illustrations are utilized encompass other embodiments as well as implementations and adaptations thereof which may or may not be given therewith or elsewhere in the specification and all such embodiments are intended to be included within the scope of that term or terms. Language designating such non-limiting examples and illustrations includes, but is not limited to: "for example," "for instance," "e.g.," "in one embodiment," and the like. Furthermore, any dimensions, materials or other such characteristics are provided by way of example and not limitation.

Figure 1:
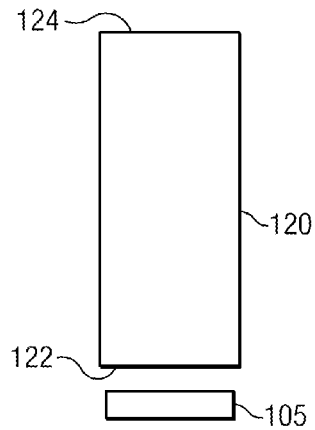
FIG. 1 is a diagrammatic representation of an embodiment of an optical system.

FIG. 1 is a diagrammatic representation of an embodiment of an optical system including light source 105 and a homogenizer 120. In one embodiment, light source 105 can include an LED chip or an array of LED chips (including for example an array of LEDs emitting different colors of light (e.g., an RGB LED array)), an LED(s) used in combination with phosphors or other light sources including sources that act as ergodic system.

In general, the purpose of a homogenizer is to allow light to bounce multiple times of sidewalls as the light propagates along the homogenizer, causing spatial variation in the source to be reduced. Accordingly, the flux per unit area exiting the homogenizer is preferably or substantially uniform. By way of example, but not limitation, homogenizer 120 can homogenize light so that the peak to valley variation in flux per unit area is less than 10% or other percentage (e.g., 5%).

In the embodiment of FIG. 1, the optical axis of homogenizer 120 is aligned with the center of source 105 and includes an entrance face 122 and an exit face 124. In other embodiments, the optical axis may be off center. Entrance face 122 can be the same size as or larger than and be parallel with the primary emitting face of light source 105. According to one embodiment, the exit face 124 (physical or virtual) of the homogenizer 120 may be parallel to the primary emitting plane of light source 105 (e.g., parallel to the primary exit face of an LED), so that homogenized light is emitted in a plane parallel to the emitting plane of light source 105. Homogenizer 120 can have a variety of shapes such as tapered or untapered. Moreover, the entrance face 122 of homogenizer 120 can have a different shape than the exit face 124. In other example embodiments, the exit face 124 of the homogenizer may not be parallel to the primary emitting plane of the light source 105.

The entrance face of homogenizer 120 defines the entrance aperture. For a given entrance face 122 size, the size of exit face 124 of the homogenizer 120 can be determined from the following EQNS. 1-4 in order to conserve brightness.

$$\frac{\phi}{n^2 A \Omega} = \frac{\phi'}{n'^2 A' \Omega'} \quad [\text{EQN. 1}]$$

$$A' = \frac{n^2 A \Omega}{n'^2 \Omega'} \quad [\text{EQN. 2}]$$

wherein $\Omega$ is the effective solid angle in which light enters the homogenizer, $\Omega'$ is the effective solid angle whereby light leaves the homogenizer, A is the area of the entrance face, n is the refractive index of the medium from which light is received by the homogenizer, n' is the refractive index of material into which the homogenizer emits.

Since the intensity distribution out of the exit face 124 may be air, the n' value is approximately 1. Furthermore, if there is a gap between light source 105 and homogenizer 120, n is also approximately 1. Since LEDs are extended sources, the value for $\Omega$ is $\pi$. With these conditions, the brightness equation reduces to:

$$A' = \frac{n^2 A \Omega}{n'^2 \Omega'} \quad [\text{EQN. 3}]$$

$$A' = \frac{A\pi}{\Omega'} \quad [\text{EQN. 4}]$$

In general, the homogenizer 120 can be configured not to change the angular distribution of light. Therefore, the area of exit face 124 can be approximately the same (or larger) than the entrance face of homogenizer 120 to conserve brightness. A larger exit face (given the similar indices of refraction of the media at either end of the homogenizer) will lead to a reduction in beam angle, but preferably, the size of exit face 124 is selected so that the difference in beam angle between the light emitted from exit face 124 and received at entrance face 122 such that the half angle of light emitted from the homogenizer 120 at a physical or virtual face is 80% of up to equal to the half angle of the light entering the homogenizer 120. Methods for determining the solid angle for a square or rectangular beam are described in U.S. patent application Ser. No. 12/788,094, which is hereby fully incorporated by reference herein.

The above example assumes a source emission angle of pi steradians (solid angle), but in cases where the source emission angle is different, the equation still applies. For instance, if the source only emits into a 60 deg full cone, then A' is equal to A Pi( )/3/$\Omega'$.

Figure 2:
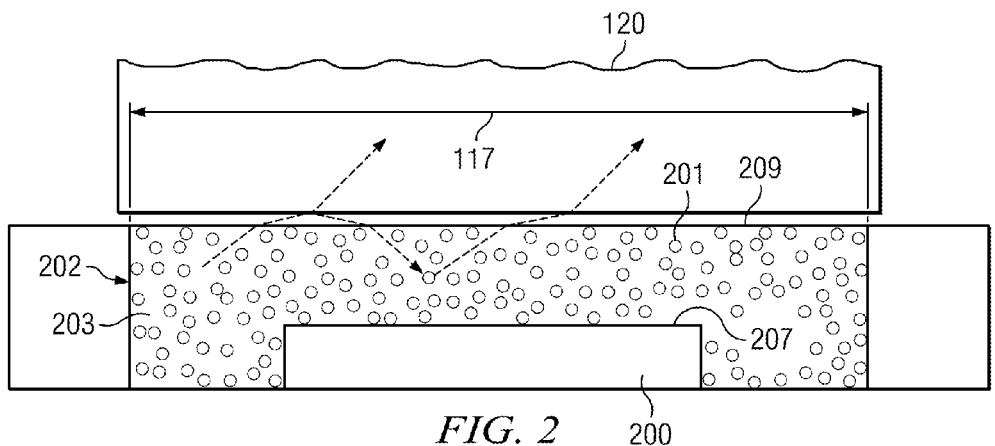
FIG. 2 provides a diagrammatic representation of one embodiment of positioning a homogenizer relative to a source.
Figure 3:
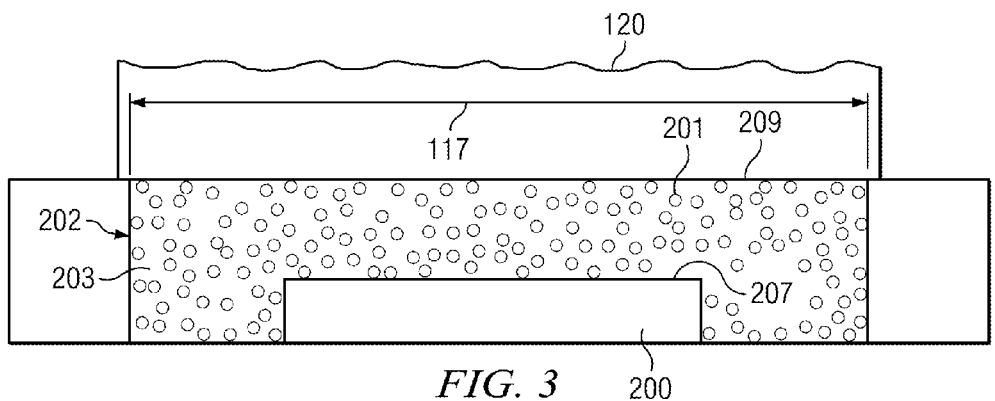
FIG. 3 is a diagrammatic representation of another embodiment of positioning a homogenizer relative to a source.

FIGS. 2 and 3 are diagrammatic representations of embodiments of positioning homogenizer 120 relative to source 105. In the embodiments of FIGS. 2 and 3, source 105 comprises LED chip or die 200 surrounded by phosphor particles 201 distributed in encapsulate 203 and disposed in a cavity 202. In the embodiments of FIGS. 2 and 3, source 105 has a generally flat emitting surface 209, in this case, parallel to the primary emitting face 207 of LED 200. In other embodiments, source 105 could have other configurations. In one embodiment, the entrance face 122 of homogenizer 120 can be the same size as or larger than the emitting surface 209 of source 105. That is, the entrance face 122 of homogenizer 120 can encompass the source. The cavity can be defined by or lined with a reflective material, such as $TiO_2$ and can have a variety of shapes.

The phosphor particles 201 can be disposed in the encapsulant 203, coated on top of the encapsulant, coated on the LED or otherwise disposed between LED 200 and the entrance face of homogenizer 120. The entrance aperture 117 of homogenizer 120 of multi-element optical stack 110 is defined by exit aperture of the source, in this example, the cavity exit.

One difference between FIGS. 2 and 3 is that, in FIG. 2, the homogenizer 120 is separated from the emitting surface of source 105 by an air gap 212, whereas, in FIG. 3, the homogenizer 120 directly contacts the emitting surface of the source (i.e., the surface of the encapsulant). For purposes of the following discussion, the embodiment of FIG. 2 will be referred to as "non-coupled," while the embodiment of FIG. 3 will be referred to as "coupled." The use of the phrase "non-coupled," in this context, merely means that a gap exists between the exit aperture of source 105 and entrance face of homogenizer 120, though the source and homogenizer are still operatively coupled.

In general, the size of the gap in the non-coupled solution can be selected so that the numerical aperture (NA) of a system incorporating homogenizer 120 remains high. By way of example, but not limitation, the gap is preferably less than 500 microns and can be approximately 100-200 microns.

While the non-coupled solution offers the advantage of a smaller exit aperture size to conserve brightness, the non-coupled solution may experience some losses. FIG. 2 illustrates several possible light paths that result in losses. At the phosphor to air interface, two events are possible. The ray refracts into air, with corresponding Fresnel reflection, or the light is reflected back into the encapsulant due to total internal reflection ("TIR"). Because phosphor is an ergodic system, rays that are reflected will have a probability of being scattered into a non-trapping mode. This continues until the light eventually escapes into the air interface between the phosphor and the homogenizer or is absorbed by the LED chip, the cavity walls, etc. Fresnel reflections at the phosphor to air interface will experience the same dynamics as the totally internally reflected light. At the air to the homogenizer interface, the light may refract into the homogenizer. Fresnel reflections off this interface will experience the same dynamics as the totally internally reflected light. Therefore, according to one embodiment, the cavity walls, chips and everything within the cavity should be as non-absorptive as possible.

In the coupled solution, light will typically not experience TIR at the phosphor/homogenizer interface as the materials of homogenizer 120 and encapsulant 203 can be selected to prevent or reduce this phenomenon as well as Fresnel reflection. Thus, while the coupled solution may require a larger exit face (or system exit aperture), the coupled solution can be overall more efficient. It is estimated that the difference in total emitted flux between coupling and not coupling may be small (5-30%). The loss is dependent on the type of chip or the geometry of the source, among other things. Thus, the selection of a coupled or non-coupled system can depend on the tradeoffs between exit aperture size and losses in total emitted flux.

Returning to FIG. 1, the length of the homogenizer 120 may further alter or modify the light distribution at the exit face 124 of the homogenizer 120. More specifically, when increasing the length of the homogenizer the light within the homogenizer 120 may be more uniformly homogenized if the sidewalls of the homogenizer 120 are not tapered. Tapered homogenizers will require a longer length for the same level of homogenization than untapered homogenizers. Accordingly, the longer the length of the homogenizer, the more homogenized the light exiting the homogenizer 120.

The material for the homogenizer 120 may be any substance or material that minimally absorbs the emitted light from the light source 105 in the emitted spectrum. Also, because the material of the homogenizer 120 may be in closer proximity to phosphor particles, a PMMI or silicone based material may form the homogenizer 120.

The shape of homogenizer 120 can be selected so that homogenizer 120 does not alter the angular distribution of the light, just the spatial distribution. According to one embodiment, the shape of the homogenizer 120 can be selected so that the half angle of light emitted from the homogenizer at the physical or virtual exit face is from 80% to equal to the half angle of light entering homogenizer 120. Furthermore, while the exit face 124 can be any desired size, preferably the exit face 124 of the homogenizer 120 is greater than 95% of the size of the entrance face, and in one embodiment is between 95-105% of the size which is necessary to conserve radiance.

Homogenizer 120 may be used in conjunction with a variety of optical elements including imaging lenses. According to one embodiment, homogenizer 120 can be used with a multi-element optical stack. FIG. 4 is a diagrammatic representation of one embodiment of an optical system including light source 105 and a multi-element optical stack 110 having first lens 112 and a second lens 114 used in combination with homogenizer 120. Multi-element optical stack 110 can be an imaging optical stack or a non-imaging optical stack and include a series of optical elements (lenses or portions of lenses arranged as doublets, triplets or other lens structures). According to the embodiment of FIG. 4, homogenizer 120 is a rectangular homogenizer with an exit face 124 at the plano surface of first lens 112. Homogenizer 120, according to one embodiment, is arranged to have a high NA. In order for brightness to be conserved (or be within some percentage of being conserved) an appropriate amount of light must be relayed from each lens to the next, such as when relaying light from first lens 112 to second lens 114, the projected beam angle of each lens can be within the acceptance cone of the next more distal lens. According to one embodiment, the projected beam angle of a lens is smaller than the projected beam angle of light emitted by the next more proximal lens. Thus, for example, in FIG. 4, the projected beam angle of second lens 114 can be less than that of first lens 112.

According to one embodiment, the multi-element optical stack can include a series of lenses that work in combination to relay approximately 100% or other percentage of light entering first lens 112 to far field. In some embodiments approximately 100%, or other high percentage (e.g., greater than 70%, 75%, 80%, 85%, 90% or 95%) of the light entering lens 112 is relayed.

Furthermore, the lenses of multi-element optical stack 110 can work in combination to achieve a high percentage of light in beam. That is, for a given projected beam angle, a high percentage of the light emitted from second lens 114 is in that beam angle (e.g., greater than 70%, 75%, 80%, 85%, 90%, 95% or 98% of light in beam). More so, in other example embodiments the projected beam angle may include any desired or required percentage of the light emitted from the second lens. The various lenses can be selected, in one embodiment, to reduce the beam angle to 1.0-25 degree half angle.

FIG. 5 is a diagrammatic representation of another embodiment of an optical system comprising light source 105, homogenizer 120 and an optical device 121. Separate optical device 121 can be a device such as described in U.S. Pat. No. 7,772,604, which hereby fully incorporated by reference, that conserves radiance, or a selected percentage of radiance, while controlling beam angle to provide a desired light distribution in the beam angle. Optical device 121 and homogenizer 120 may be separate pieces or may be integrated.

Optical device 121 can have an exit face 129 of any desired size. Preferably, though, the exit face 129 is at least a minimum size necessary to conserve radiance or is greater than 95% of the size necessary to conserve radiance for a desired emission half angle. Optical device 121 can be shaped so that approximately 100%, or other high percentage (e.g., 70%, 75%, 80%, 85%, 90% or 95%) of the light entering optical device is relayed to far field. Furthermore, for a given projected beam angle, a high percentage of the light emitted from optical device 121 is in that beam angle (e.g., greater than 70%, 75%, 80%, 85%, 90%, 95% or 98% of light in beam).

Optical device 121 can be configured with shaped sidewalls to reduce light distribution received from real or virtual exit face 124 into the selected beam angle through TIR in a single optical element. By way of example, but not limitation, optical device 121 can reduce the beam half angle to 10-60 degrees.

FIG. 6 is a diagrammatic representation of another embodiment of an optical system 100 having a light source 105 and a multi-element optical stack 110 and a homogenizer 120. According to one embodiment, multi-element optical stack 110 includes a first optical element 125, a second optical element 127 and a third optical element (represented as second lens 114). First lens 112, in this embodiment, is a doublet formed from optical element 125 and optical element 127. Optical element 125 and homogenizer 120 are integrated in a homogenizer housing structure 150 that includes optical element 125 portion and a homogenizer 120 portion. Optical elements 125 and 127 are coupled together (e.g., using optical adhesive or other joining mechanism).

According to one embodiment, multi-element optical stack 110 can be formed so that exit aperture 118 of the optical stack 110 or the exit face 124 of the homogenizer 120 is (within manufacturing tolerances) or is at least the size necessary to conserve radiance for a given system in a particular medium (e.g., air or another medium).

In another embodiment, the exit aperture 118 of the optical stack 110 or exit face 124 of homogenizer 120 can be between 95-105% of the size necessary to conserve radiance. In other embodiments, the exit aperture of the optical stack 110 or exit face of homogenizer 124 can be at least some percentage (i.e. 70%, 75%, 80%, 85%, 90% or 95%) of the size necessary to conserve radiance.

Having a smaller exit aperture of the optical stack 110 reduces brightness. However, this may result in a desired intensity distribution yielding softer illumination edges. Thus, the selection of exit aperture can be made to balance size, profile and brightness.

In the embodiment illustrated in FIG. 6, optical element 125 comprises a first surface 151 facing light source 105 and a second surface 152 on the opposite side of lens 112 (an "exit surface" 152). Surface 151 can be flat or have some other desired shape. Exit surface 152 of optical element 125 is concave and complements convex entrance surface 154 of optical element 127. The surface of optical element 127 on the opposite side of optical element 127 from the source (i.e. exit surface 156 is also convex. The surface of lens 114 facing the source (i.e. entrance surface 158) is slightly concave, while the surface of lens 114 facing away from the source (i.e. exit surface 160) is convex.

The surfaces of the optical elements/lenses may be coated, textured or patterned to achieve desired results. For example, homogenizer entrance face 122, exit surface 156, second lens entrance surface 158 and/or second lens exit surface 160 can be coated with an AR coating or patterned with an AR pattern, such as moth eye. In one embodiment, surface 160 can be textured to provide more diffuse light. As another example, surfaces 156 and 160 can be patterned with diffractive optical elements. Diffractive optical elements (DOEs) are optical components that spatially vary a lens thickness to change the optical path length that the wavefront experiences at various points along a lens. DOEs are typically patterned microstructures on the surface of a lens. In one embodiment, a DOE is selected to control color, such as for reducing blue-red separation or chromatic aberration.

Further, homogenizer 120 extends from surface 151 to entrance face 122, preferably parallel to and coaxially with the optical axis of lens 112. Homogenizer 120 can be straight or tapered and may be configured to shape light into a square, rectangle, circle or other shape (including arbitrary images and letters). Furthermore, while homogenizer 120 is depicted with a straight optical axis, homogenizer 120 may curve or change directions such that the exit face 124 is not parallel to or aligned with the emitting surface of the source.

Figure 7:
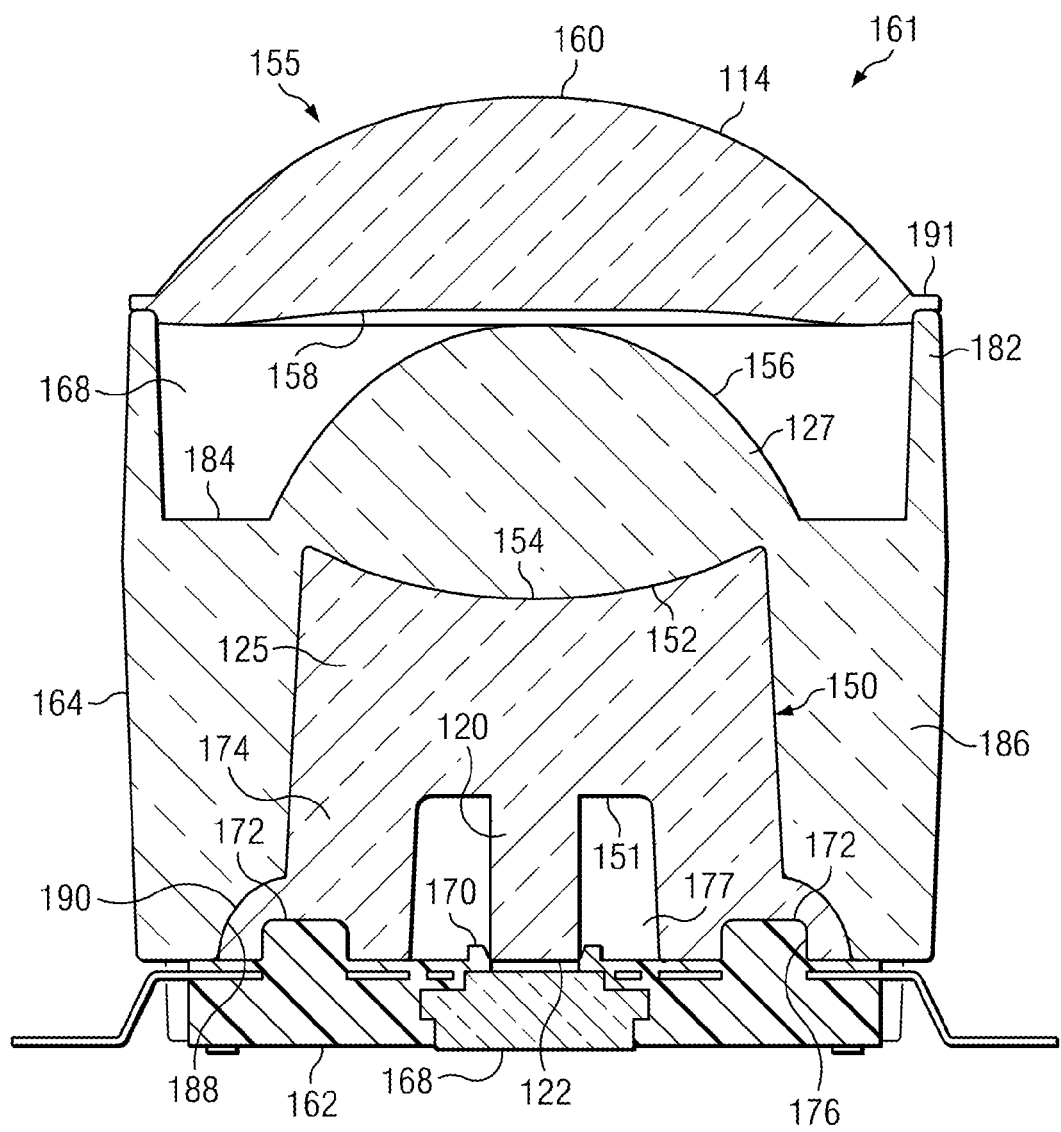
FIG. 7 is a diagrammatic representation of one embodiment of elements within an optical device.

FIG. 7 is diagrammatic representations of one embodiment of an optical device 161 comprising an LED housing 162, homogenizer housing structure 150, a lens housing 164 and second lens portion 155. Optical device 161 incorporates an embodiment of the optical system of FIG. 6, with homogenizer housing structure 150 having a homogenizer 120 portion and a first optical element 125 portion and lens housing 164 integrating the second optical element 127. Optical element 125 and optical element 127 are arranged as a doublet to form first lens 112.

LED housing 162 defines a cavity in which an LED chip is disposed. The base of the cavity can be formed by a heat sink 168, such as a copper plug or other heat sink that passes through LED housing 162. A set of alignment walls 170 extending upwards from around the edges of the cavity can aid in aligning the homogenizer 120 over the LED with an air gap between the LED and entrance face 122 of homogenizer 120. According to one embodiment, the opening to cavity in which the LED is disposed and homogenizer 120 are approximately the same size.

LED housing 162 can also include alignment features to help ensure homogenizer housing structure 150 is properly aligned with LED housing 162. As one example, LED housing 162 can include bosses 172 extending from the upper surface of LED housing 162 that are received by corresponding boss receiving cavities 176 in homogenizer housing structure 150.

Homogenizer housing structure 150 comprises a portion forming optical element 125, a portion forming homogenizer 120 and a support member 174 formed of unitary piece of material or multiple parts coupled together. Optical element 125 comprises a first surface 151 facing source 105 and a second surface 152 on the opposite side of optical element 125 (an "exit surface" 152). Surface 152 is concave with geometry such that light enters optical element 127 in the acceptance angle of optical element 127. Surface 151 can be flat or have other desired shape.

Homogenizer housing structure 150 can further include a support member 174, such as an annular wall, extending from surface 151 to LED housing 162. Support member 174 can include boss receiving cavities 176 to receive bosses 172. Support member 174 creates a homogenizer cavity 177 around homogenizer 120. Typically, the cavity will be filled with air to promote TIR in homogenizer 120, though other medium may be used.

Lens housing 164, according to one embodiment, forms an integrated housing and intermediate optical element 127. Lens housing 164, in the embodiment of FIG. 7, is shaped to form a first cavity 188 (the "lens cavity") and a second cavity (the "doublet cavity") on opposite sides of optical element 127. Lens cavity 188 is defined by cavity walls 182 and a cavity base surface 184 that extends across the base of cavity 188. Cavity walls 182 extend upward from base surface 184 in a direction away from LED housing 162. The ends of cavity walls 182 are spaced so that lens 114 can rest with surface 158 of lens 114 contacting surface 156 of lens 116 or separated from surface 156 a selected distance. Thus, lens housing 164 can be used to set the focus of optical device 161. Additionally, cavity walls 182 can be spaced from the edge of optical element 127 so that all or substantially all the light projected from lens 112 can enter lens 114 without hitting the cavity walls 182.

Housing support member 186 extends from base surface 184 toward LED housing 162. According to one embodiment, housing support member 186 can comprise an annular wall that partially defines the doublet cavity. The doublet cavity is shaped to receive homogenizer housing structure 150 so that concave surface 152 contacts entrance surface 154 of optical element 127 (the surface of optical element 127 facing the source).

Lens housing 164 can include features corresponding to alignment features of homogenizer housing structure 150. For example, lens housing 164 can include alignment recesses to receive extensions 190 of homogenizer housing structure 150. Preferably, the corresponding alignment features provide a mechanism to axially align optical element 125 with optical element 127.

Second lens portion 155 of FIG. 7 includes lens 114 having a slightly concave surface 158 on one side and a convex surface 160 on the other side. Additionally, second lens portion 155 includes an annular flange 191 extending outward from lens 114, perpendicular to the optical axis of second lens 114. Flange 191 can rest on cavity wall 182 or other shoulder defined by lens housing 164.

In FIG. 7, the inside surfaces of alignment walls 170 can be tapered so that homogenizer 120 settles in the proper position. The walls can be shaped so that homogenizer 120 is separated from the LED by a small gap.

Figure 8A:
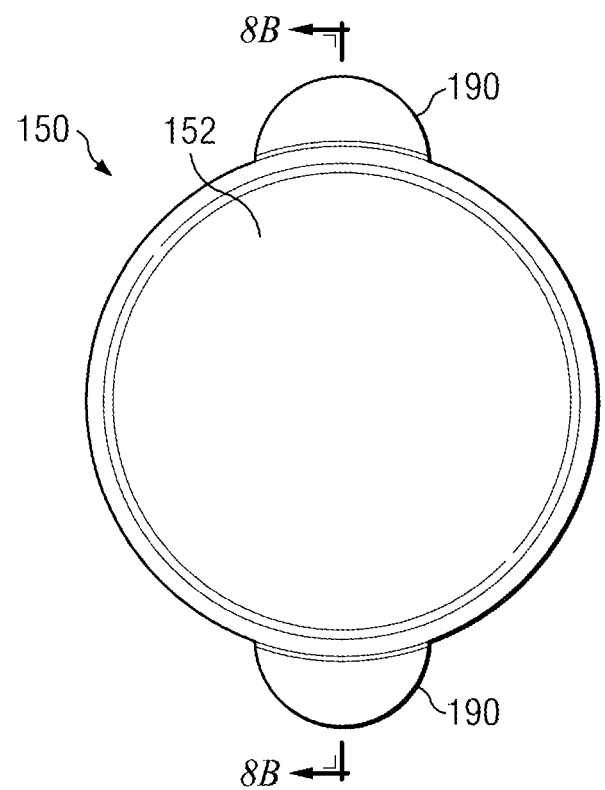
FIGS. 8A-D are diagrammatic representations of one embodiment of a homogenizer housing structure.
Figure 8B:
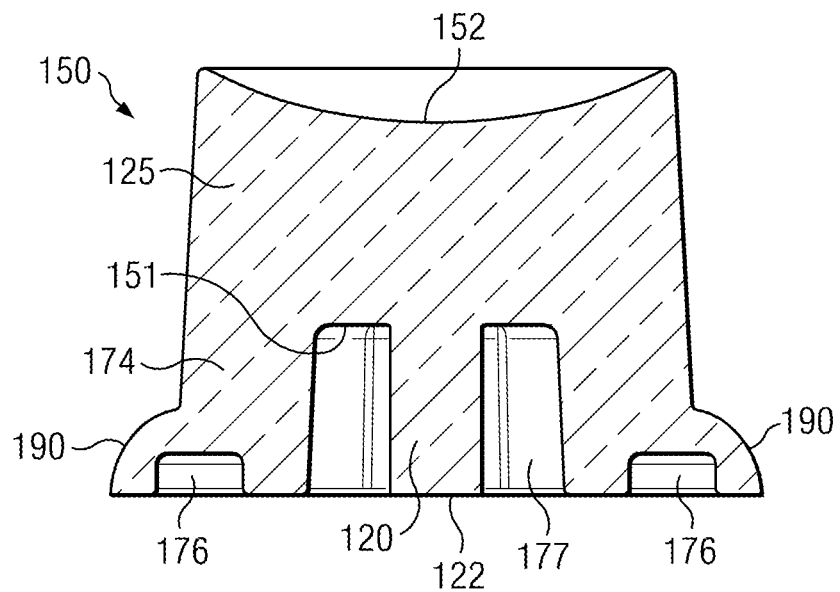
Figure 8C:
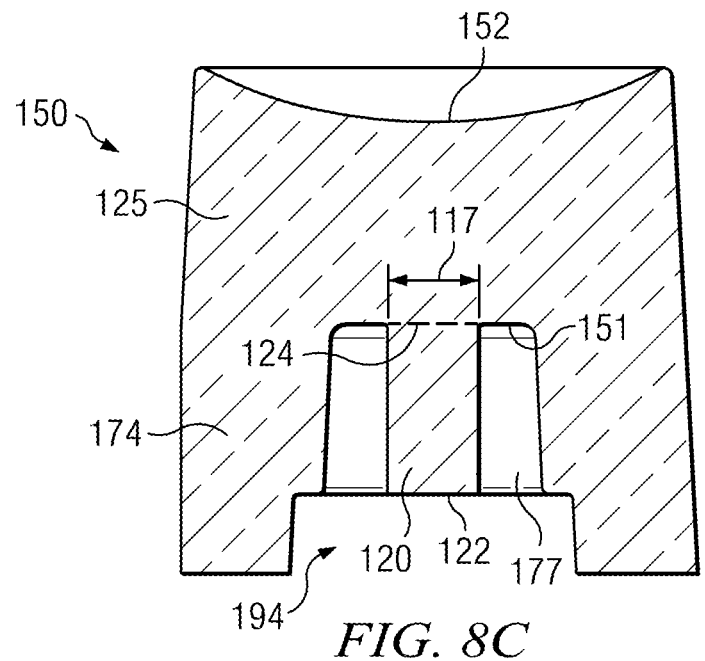
Figure 8D:
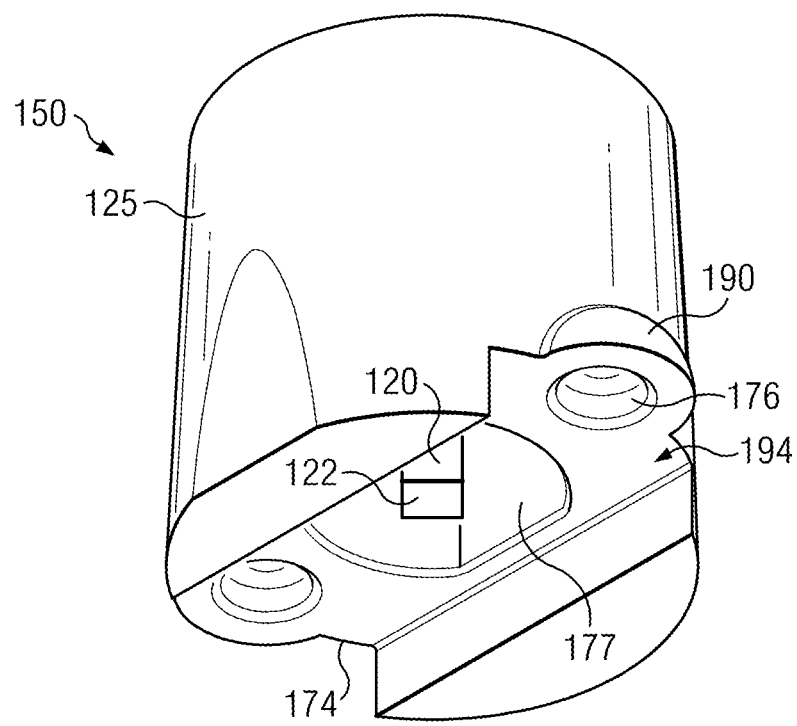

FIGS. 8A-D are diagrammatic representations of one embodiment of homogenizer housing structure 150. FIG. 8A is a view of homogenizer housing structure 150 looking into exit face 152 of optical element 125, FIG. 8B is a cross-section along line B-B of FIG. 8A and FIG. 8C is a cross-section along line A-A of FIG. 8A.

According to one embodiment, homogenizer housing structure 150 comprises a generally cylindrical structure extending from a first end to a second end. Homogenizer housing structure 150 may taper outward from the first end to the second end. A surface 152 at the first end defines the exit face of optical element 125 and acts as a refractive surface to emit light in a selected beam angle. At the second end, the homogenizer housing structure 150 defines a LED frame passage 194 open at the second end of the homogenizer housing structure 150 and extending across the homogenizer housing structure 150 lateral to the optical axis of homogenizer housing structure 150. Lateral passage 194 can be sized to accommodate the width of LED housing 162. Homogenizer housing structure 150 further defines homogenizer cavity 177 open to lateral passage 194 and extending a distance into the homogenizer housing structure surface 151 that, in this embodiment, extends generally lateral to the optical axis of homogenizer housing structure 150. Generally lateral surface 151 extends laterally from an annular sidewall (e.g., support member 174) to homogenizer 120.

Homogenizer housing structure 150 further comprises homogenizer 120 extending a length parallel to the optical axis from lateral surface 151 a distance to homogenizer entrance face 122, defined in a plane perpendicular to the optical axis. Homogenizer 120 transitions into lens 112, which extends from surface 151 to the exit face 152 of the optical element 125.

The transitioning of the homogenizer 120 into lens 112 may be based on a shape of entrance face 122 of the homogenizer 120 and a shape of the virtual exit face 124 of the homogenizer 120. For example, the entrance face 122 of the homogenizer 120 may have a square shape, whereas the exit face 124 of the homogenizer 120 may have a circular shape. Furthermore, the surface area at the exit face 124 may be equal to or greater than the surface area of the entrance face 122 of the homogenizer 120 to limit, reduce or null light loss through the homogenizer 120. The virtual exit face 124 of homogenizer 120, in the embodiment of FIGS. 8A-D, defines the entrance aperture 117 of first lens 112.

Further, the entrance face 122 of the homogenizer 120 may be square shaped to maximize or increase the coverage of light emitted from a light source 105 and transition into an exit face 124 of a second shape such as a circle.

Figure 9A:
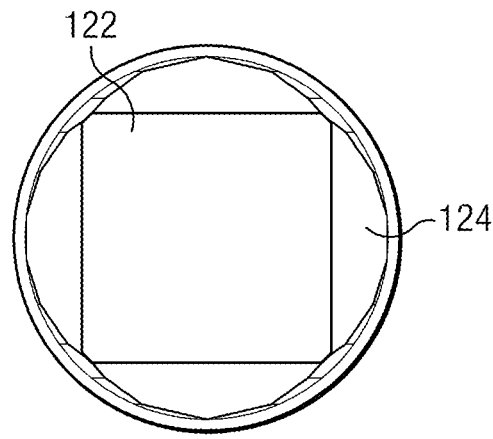
FIGS. 9A-B are diagrammatic representations of one embodiment of a homogenizer.
Figure 9B:
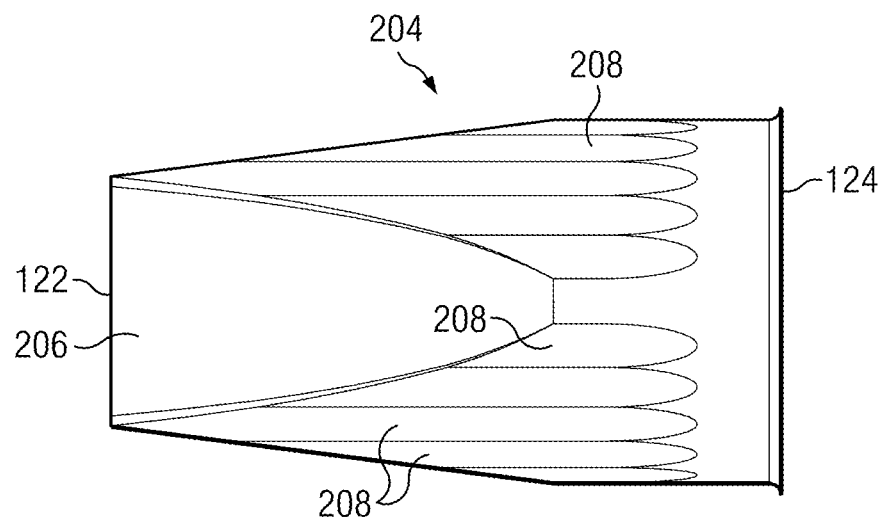

FIGS. 9A-B are diagrammatic representations of one embodiment of a homogenizer 120 for converting from a square to circular shape. FIG. 9A is view of homogenizer 120 looking at entrance face 122 and FIG. 9B is a diagrammatic representation of a side view of homogenizer 120.

Homogenizer 120, in FIGS. 9A-B, comprises entrance face 122, exit face 124 and sidewall(s) 204 extending from entrance face 122 to exit face 124. The shape of exit face 124 is selected to have at least the same area as entrance face 122. In this example, the diameter of exit face 124 is approximately equal to the diagonal of entrance face 122, making exit face 124 slightly larger than entrance face 122. Because of the difference in shape, sidewalls 204 are slightly tapered.

The sidewalls 204 of homogenizer 120 are shaped to transition from the shape of the entrance face to the shape of the exit face (e.g., from a square entrance face 122 to a round exit face 124 or between other geometric or arbitrary shapes). The sidewalls 204 comprise multiple sets of facets, curves or other transition features. According to one embodiment a first set of facets 206 correspond to a shape of the entrance face while a second set of facets 208 correspond to a transition shape between the shape of entrance face 122 and exit face 124 (that is, a shape that begins to more closely approximate the shape of exit face 124). Additional sets of facets can correspond to any number of other shapes between the shape of entrance face 122 and exit face 124. In the embodiment of FIGS. 9A-B, facets 206 correspond to a square shape, and facets 208 correspond to a hexadecagon.

The shape of homogenizer 120 can be formed using a base shape having the appropriate size and shape for exit face 124. For the example of FIGS. 9A-B, the base shape is a cylinder. Facets 206 are formed based on an extruded cut made with the shape of the entrance face 122, with the cut tapering outward along a defined angle. Thus, facets 206 correspond to a square shape extruded cut (regardless of whether homogenizer 120 is actually formed by cutting, molding or some other process). Even more specifically, in the example of FIGS. 9A-B, facets 206 correspond to a square shape making an extruded cut with a taper angle 7.25 degrees such that the entrance face 122 has the desired shaped and size and the sidewalls taper outwards. Facets 208 are formed based on an extruded cut made using a hexadecagon with a taper angle of 1 degree.

In other embodiments, facets can correspond to other shapes with the same or different taper angles. For example, to transition from a square to a circle, facets can be formed based on extruded cuts using hexagonal, octagonal and or other shapes. The sidewalls 204 may include any number of different sets of facets formed based on any number of shapes between the shape of entrance face 122 and exit face 124.

Furthermore, while in the embodiment of FIGS. 9A-B the transition features are formed based on straight extrusion cuts corresponding to geometric shapes, other embodiments can include transition features corresponding to arbitrary shapes. Furthermore, the transition features may include simple or complex curves to transition from the shape of entrance face 122 to exit face 124.

In one embodiment, a homogenizer that transitions from a first shape to a second shape can be modeled in a 3-D modeling program such as SOLIDWORKS by Dassault Systems SolidWorks Corp. of Concord Mass. and the resulting shape can be entered in a ray tracing program, such as ZEMAX by Radiant ZEMAX LLC of Bellevue, Wash. Ray tracing can be performed to determine the flux per unit area given by a particular shape.

Iterative adjustment of the shape of the homogenizer 120 can be performed until a satisfactory output is determined. More specifically, the number of facets, the length and/or the taper angle of the homogenizer may be iteratively adjusted. Preferably, the homogenizer is selected so that the difference in half angle of light emitted from exit face 124 and the half angle of light entering homogenizer 120 is less than 20%. Furthermore, the homogenizer is preferably configured so that the peak to valley difference of flux per unit area of light emitted is less than 10%.

With or without a homogenizer, various embodiments of optical systems can be configured so that greater than 75%, including greater the 95%, of the light entering lens 112 is projected into far field (referred to herein as transmission efficiency) in a desired beam angle (referred to as percent in beam), not counting Fresnel losses. However, even at lower transmission efficiencies and percent in beam, optical devices of the present application provide superior beam shaping capabilities. If a smaller percent in beam is desired, tradeoffs between the exit aperture and the percent in beam may also be made. Lenses can be formed to account for this tradeoff per the system requirement.

FIGS. 10-15 represents model illumination patterns of light emitted by the optical device having a lens configuration similar to that illustrated in FIG. 7 with homogenizers having different exit face shapes. As can be seen in FIGS. 10-15, the illumination profile within the selected angle can be noticeably uniform. In these embodiments, the area of the exit face was large enough to conserve radiance and the homogenizer was configured to transition from a square entrance face shape to the exit face shape.

Figure 10:
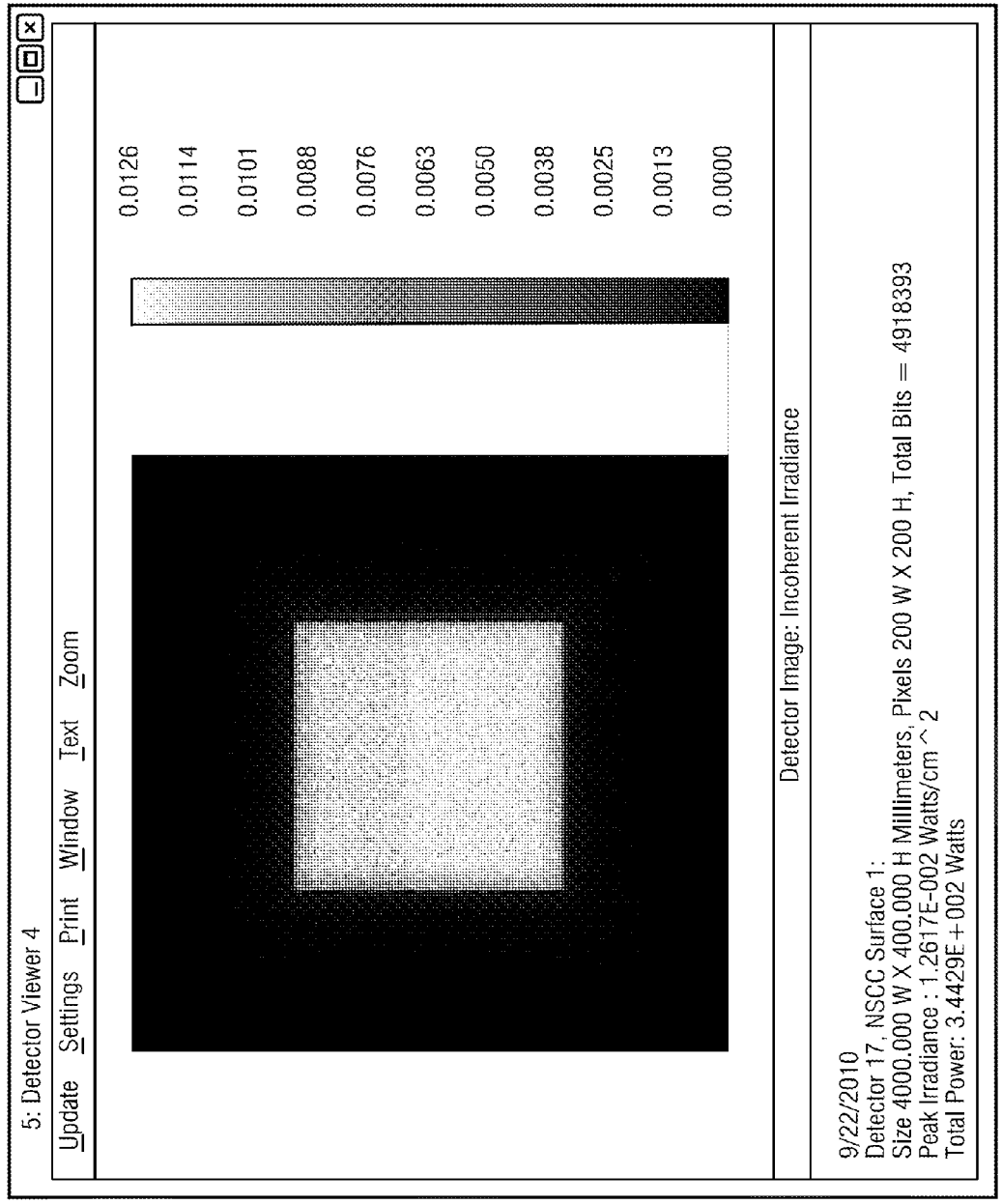
FIGS. 10-15 are diagrammatic representations of model illumination patterns for embodiments of an optical system.

In FIG. 10, both the entrance and exit faces of the homogenizer may be substantially square shaped. Of 5,000,000 rays traced, greater than 4,910,000 rays (98% of the rays) arrive on the far field detector plane, indicating near conservation of radiance in the multi-element optical stack.

Figure 11:
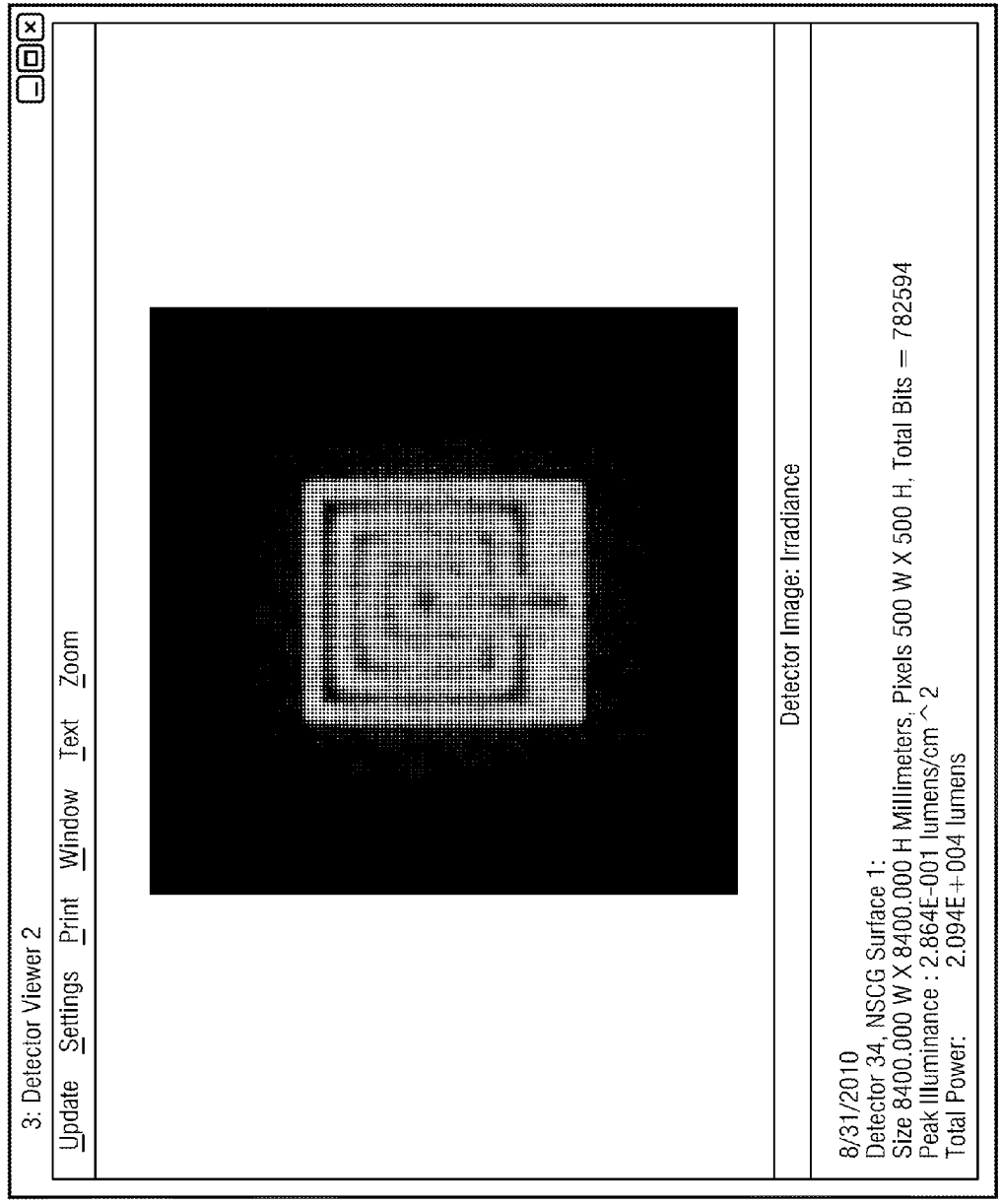

In FIG. 11, the shape of an entrance aperture may be substantially square, while the shape of the exit aperture may have a substantially square border with internal patterns to create an arbitrary shape. In FIG. 11, of 1,000,000 rays traced, greater than 780,000 rays (78% of the rays) arrive on the far field detector plane, indicating substantial conservation of radiance in the multi-element optical stack. FIG. 11 demonstrates that light can be shaped into an arbitrary shape with high conservation of radiance (greater than 70%) in a high NA optical system.

Figure 12:
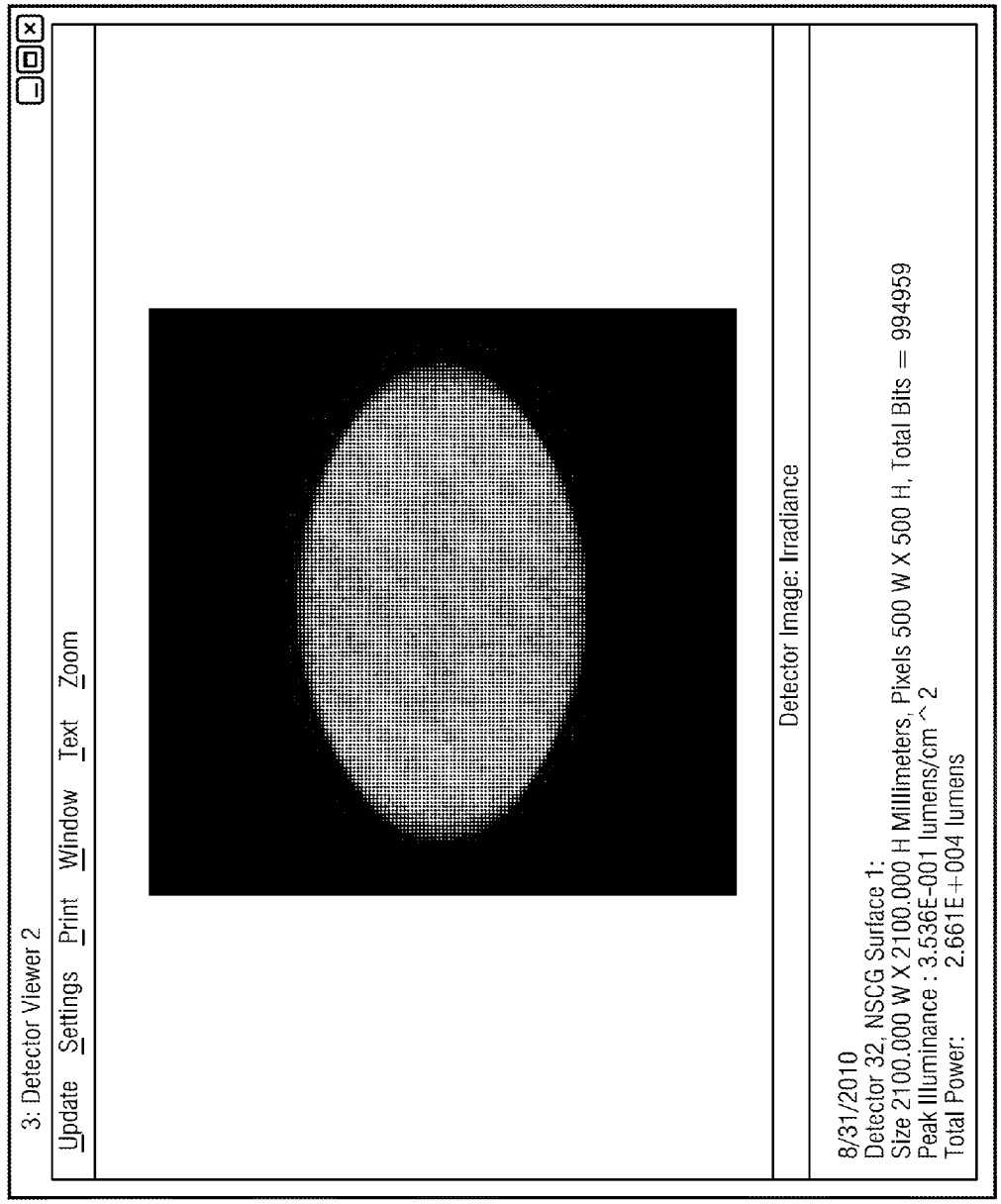

In FIG. 12, the shape of an entrance aperture may be substantially square, while the shape of the exit aperture may be substantially ovular. In FIG. 12, of 1,000,000 rays traced, greater than 994,000 rays (99% of the rays) arrive on the far field detector plane, indicating near or substantial conservation of radiance in the multi-element optical stack.

Figure 13:
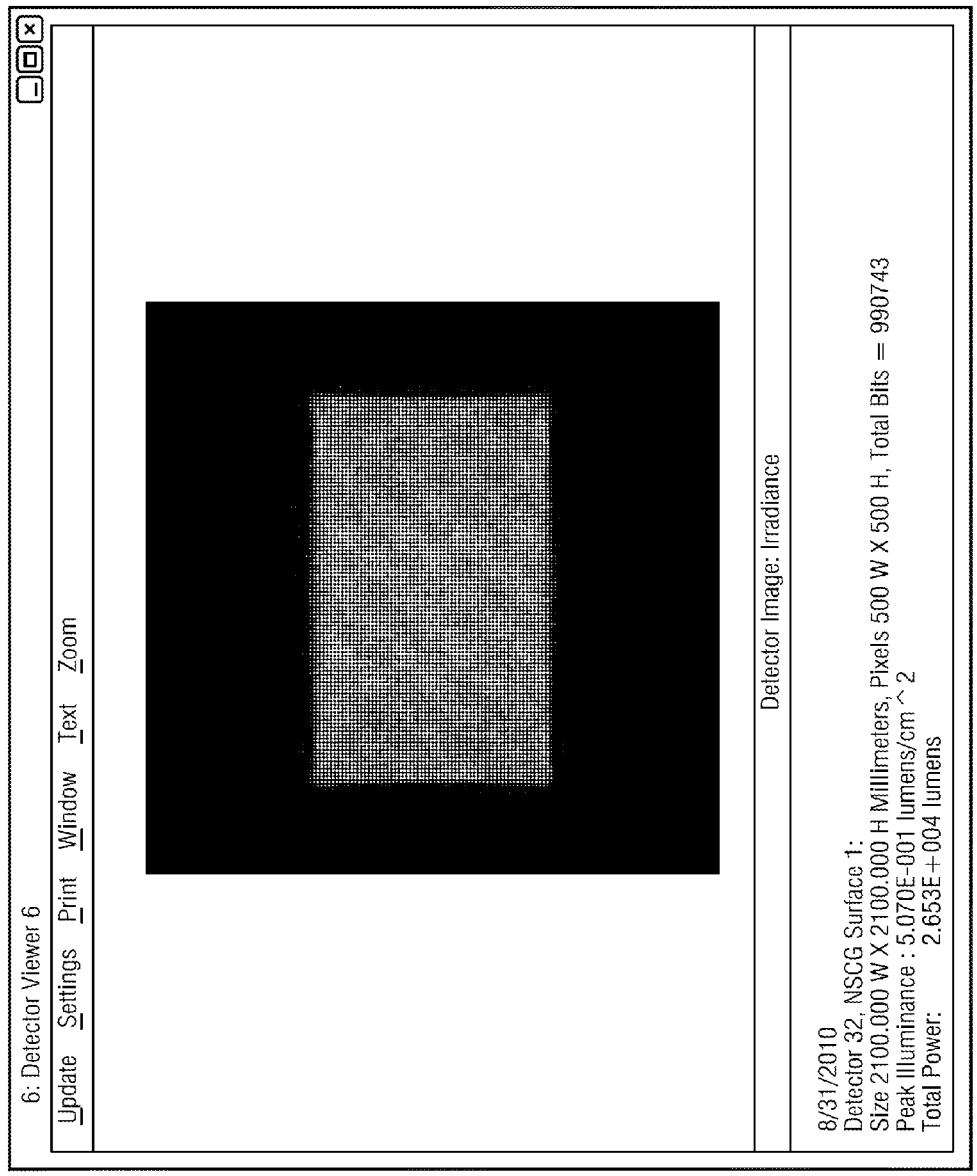

In FIG. 13, the shape of an entrance aperture may be substantially square, while the shape of the exit aperture may be substantially rectangular. In FIG. 13, of 1,000,000 rays traced, greater than 999,000 rays (99% of the rays) arrive on the far field detector plane, indicating near or substantial conservation of radiance in the multi-element optical stack.

Figure 14:
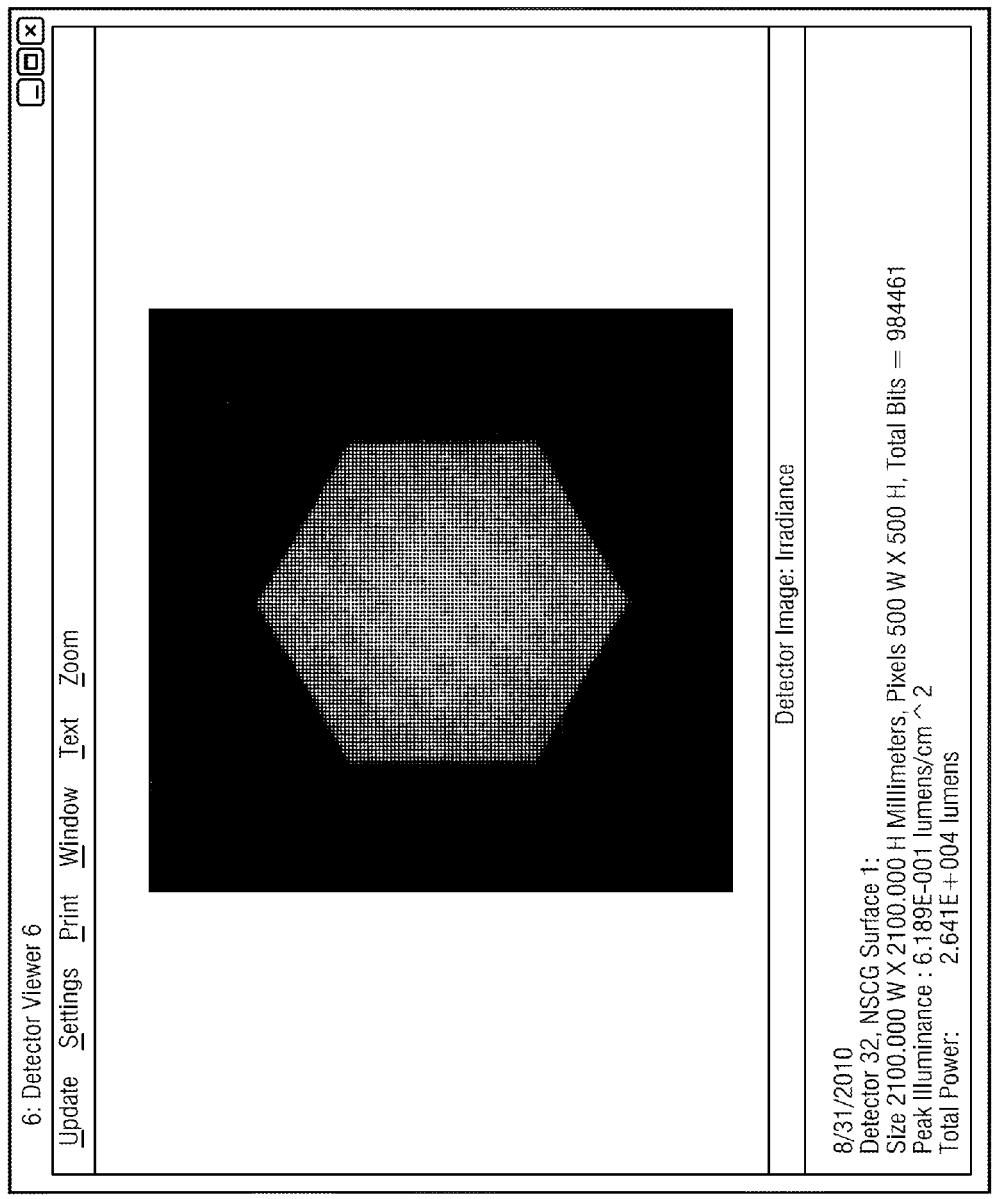

In FIG. 14, the shape of an entrance aperture may be substantially square, while the shape of the exit aperture may be substantially hexagonal. In FIG. 14, of 1,000,000 rays traced, greater than 984,000 rays (98% of the rays) arrive on the far field detector plane, indicating near or substantial conservation of radiance in the multi-element optical stack.

Figure 15:
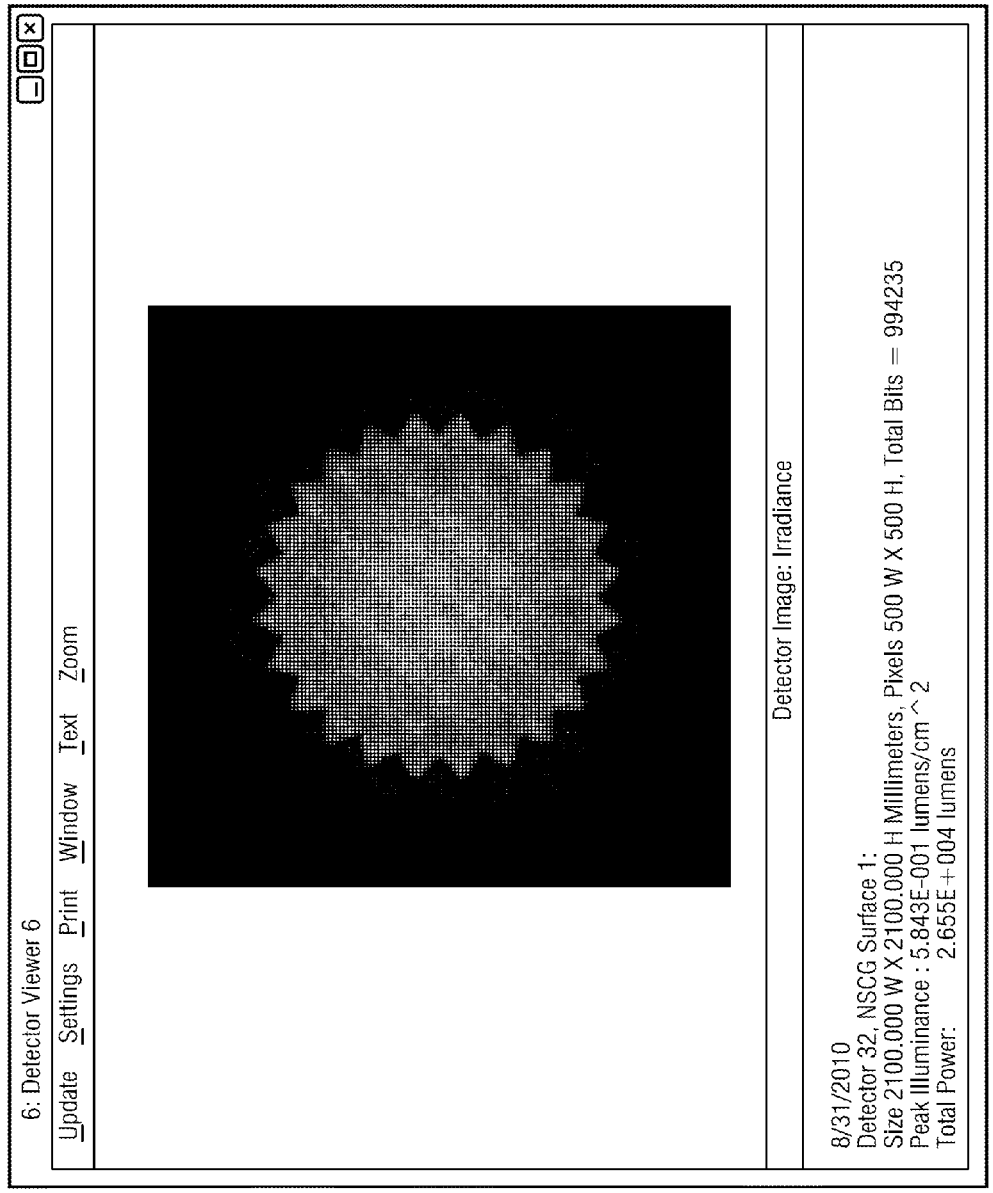

In FIG. 15, the shape of an entrance aperture may be substantially square, while the shape of the exit aperture may be substantially circular with a ridged circumference. In FIG. 15, of 1,000,000 rays traced, greater than 994,000 rays (99% of the rays) arrive on the far field detector plane, indicating near or substantial conservation of radiance in the multi-element optical stack.

In the foregoing examples, the intensity distribution may not be entirely uniform due to design constraints. However, the optical system still projects an image into far field of the corresponding to the shape of the exit face 124 that is easily discernable.

Figure 16:
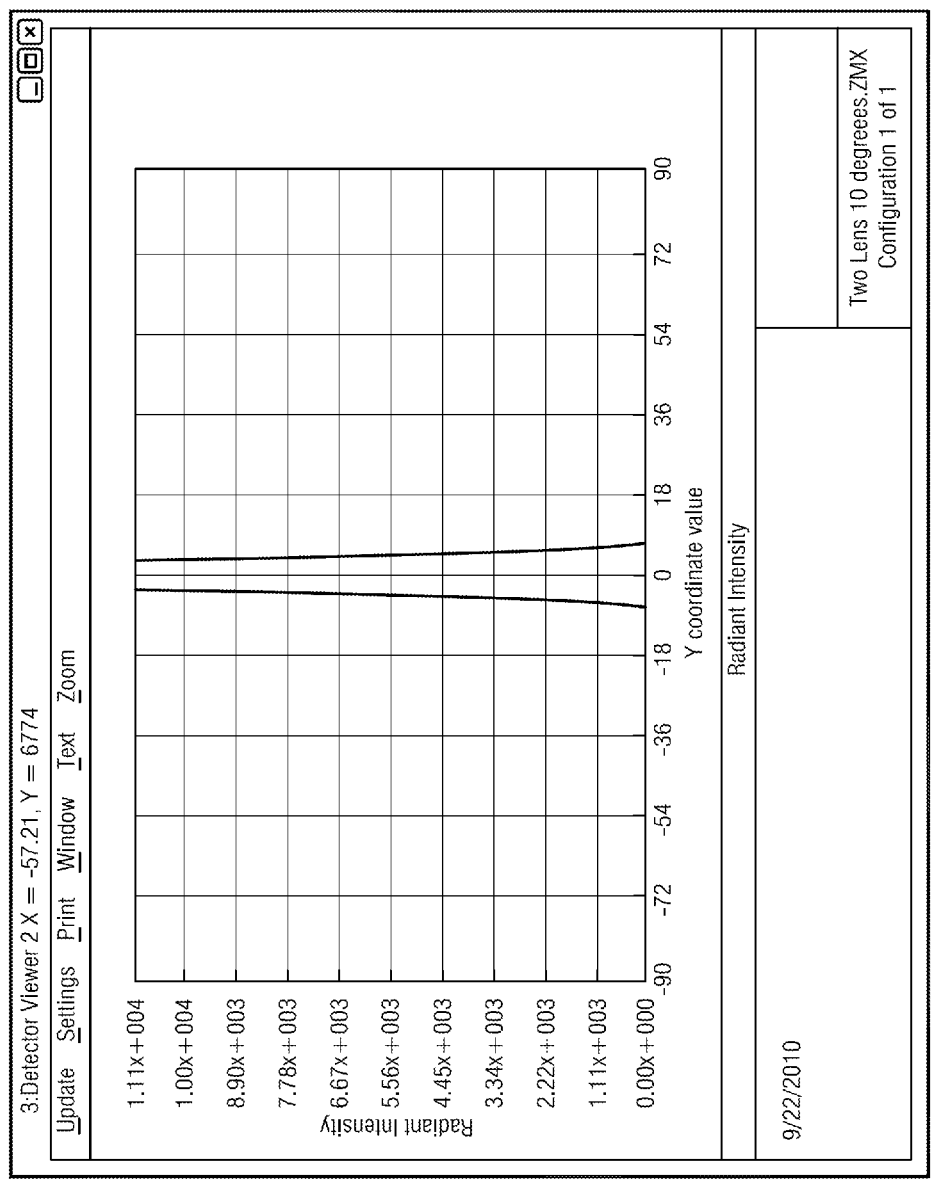
FIG. 16 is a chart of radiant intensity versus beam angle for one embodiment of an optical system.

FIG. 16 is a chart of radiant intensity (y-axis) versus beam angle (x-axis) and illustrates that embodiments of an optical system, such as illustrated in FIG. 4, can act to create a "digital" light distribution in which greater than 80%, and in this case greater than 90%, of the light is within the desired beam angle and the remaining light is within a very small range to create a sharp cutoff. Using homogenizer 120 that homogenizes light from an entrance face of a first shape to an exit face of a second shape, the optical stack 110 may emit light at different patterns within a desired beam angle.

Figure 17:
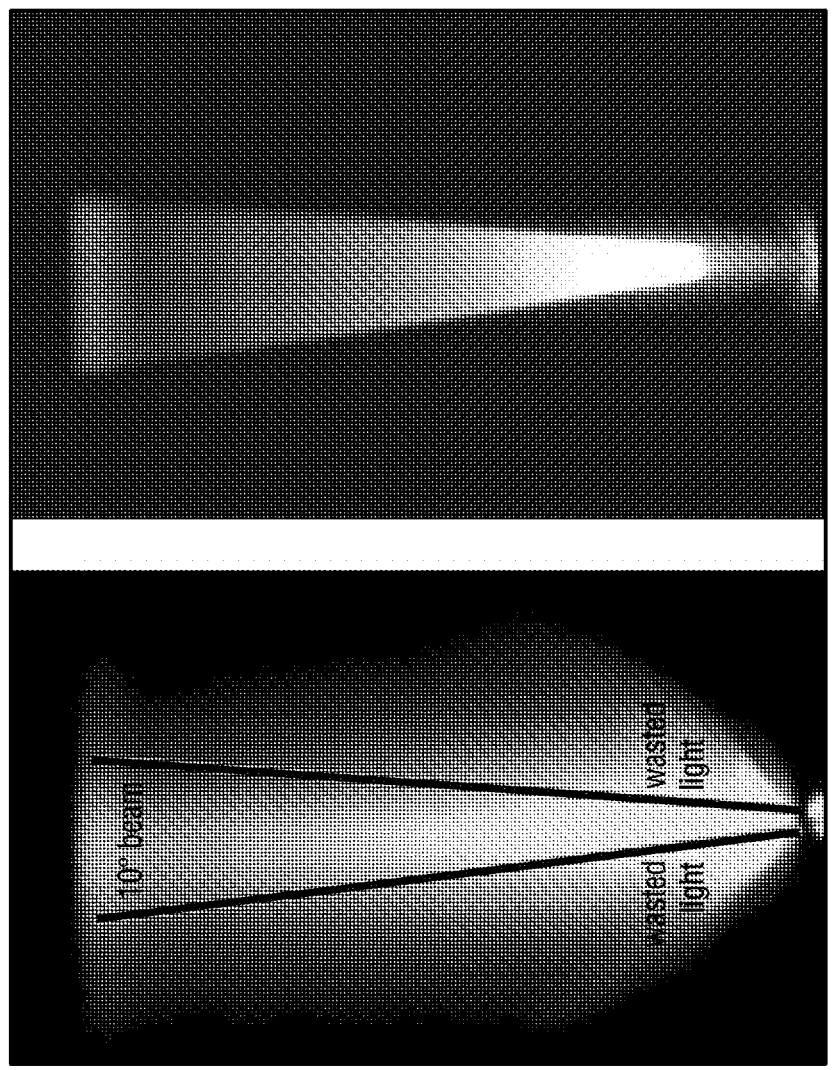
FIG. 17 is a diagrammatic representation illustrating the advantage of a high percentage of light in beam.

FIG. 17 illustrates the advantage of high light in beam. A high light in beam means that there is much less wasted light outside of desired projected beam angle. FIG. 17, illustrates the difference between a system that provides 28% Lumens in Beam versus a system that provides 90% of Lumens in Beam to illustrate the advantages of embodiments described herein.

Figure 18:
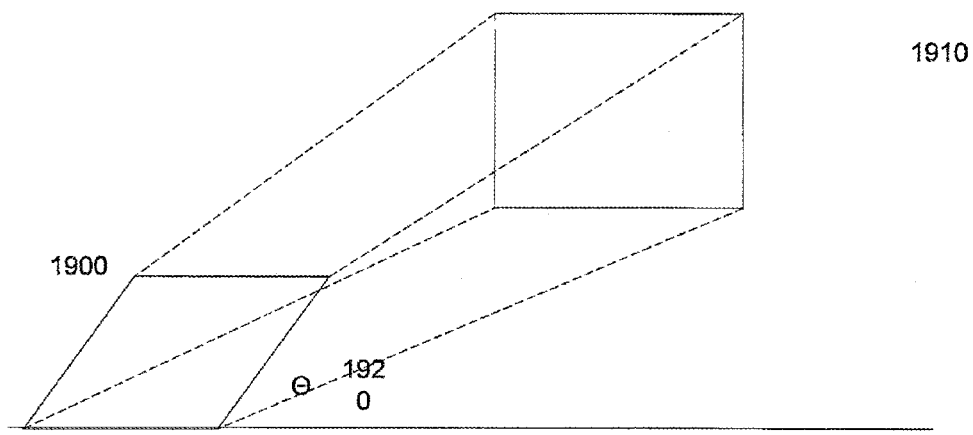
FIG. 18 is a diagrammatic representation of one embodiment of projecting light from an optical system to create a square or rectangular optical pattern.

FIG. 18 illustrates one embodiment for an illumination pattern 1900 of an optical device utilizing a homogenizer (and optical device having a lens configuration similar to that illustrated in FIG. 7) to project light onto a plane 1910. According to one embodiment, the illumination pattern emitted by the optical device may be rhombus shape as determined by the exit face of a homogenizer. The shape of the rhombus can be selected so that when optical system projects onto plane 1910 at an angle theta θ 1920, the illumination pattern appears square or rectangular at plane 1910.

Thus, the optical system 1900 may utilize a homogenizer to project light at an angle theta θ 1920 towards the plane 1910 that results in a square illumination pattern. For example, the optical system 1900 may be configured to project images onto a plane 1910 that is a billboard, a wall, or any other medium capable of receiving a projected image.

Figure 19:
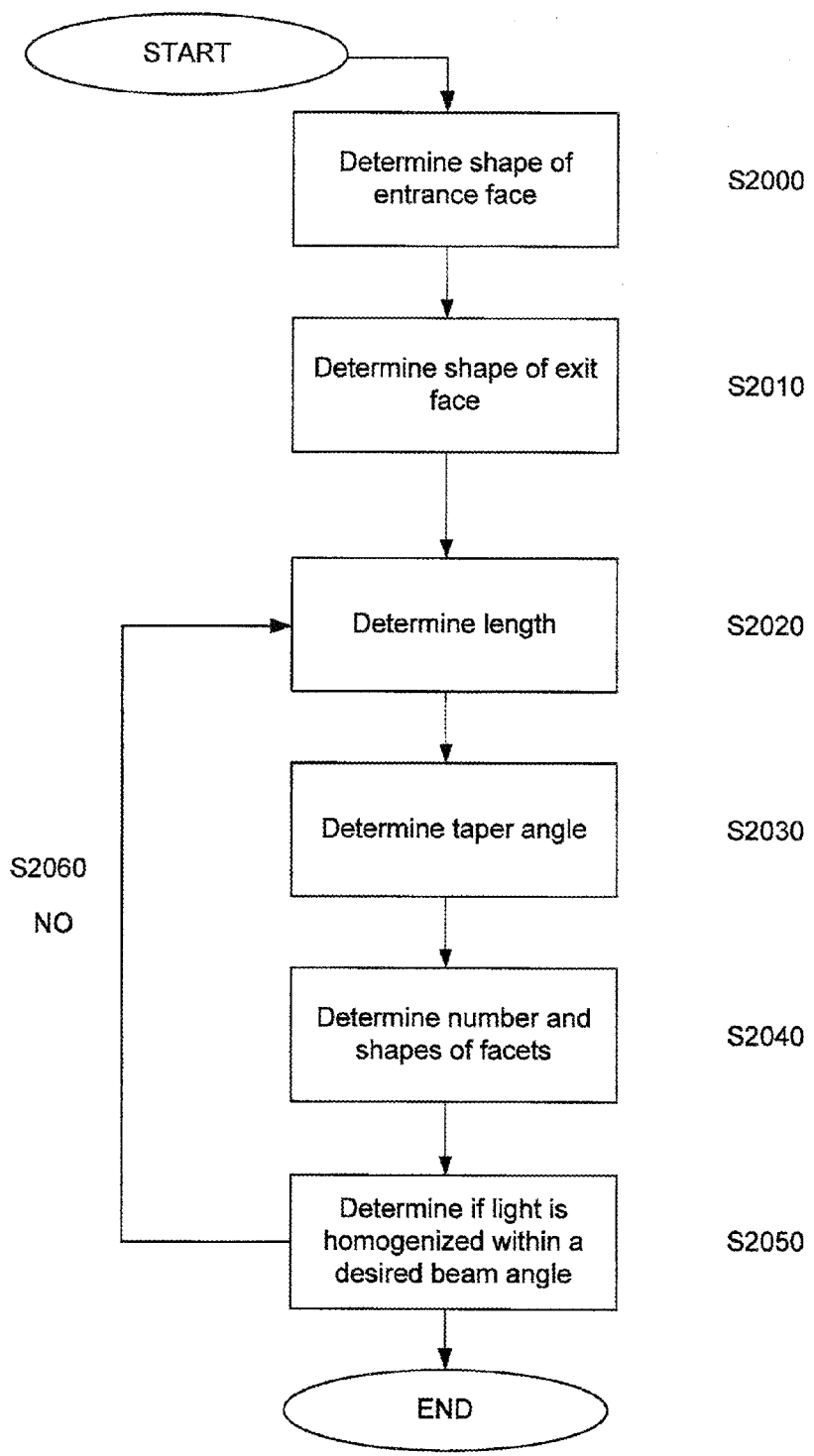
FIG. 19 is a flow chart representing at least one embodiment for determining the shape of a homogenizer.

FIG. 19 is a flow diagram representing one embodiment for determining the shape of a homogenizer 120 as referenced above.

In S2000, the shape of an entrance face of a homogenizer may be determined. The entrance face may be based on any criteria or user preference. Further, the shape of the entrance face may be determined so that all or substantially of the light emitted by a source enters the entrance face. Therefore, the shape of the entrance face may be based on the dimensions and shape of a light source.

In S2010, the shape of an exit face of the homogenizer may be determined. The shape of the exit face may be any shape. Further, the shape of the exit face may be determined to reduce the beam angle of the light emitted by the homogenizer. Further, the exit face may be configured to conserve the amount of light emitted at the exit face.

In S2020, the length of the homogenizer may be determined. The length of the homogenizer may be determined to fit within an LED housing or any other design requirements of an optical system. Further, the length of the homogenizer may be based on the design criteria for flux per unit area of the exit face. As such, longer homogenizers allow light to bounce a plurality of times off the sidewalls of the homogenizers as light propagates through the homogenizer. Therefore, longer homogenizers allow for greater angular control of the light within the homogenizer and may emit substantially uniform light at the exit face of the homogenizer.

In S2030, the taper angle of the sidewalls of the homogenizer may be determined. However, in particular embodiments the sidewalls of the homogenizer may not be tapered. Further, the taper angle/angles of the sidewalls may be angled to transition from the first shape of the entrance face to the second shape of the exit face.

In S2040, the configuration of the transition features can be determined. For example, the number of facets, curves or other transition features in the homogenizer and the shapes of the facets, curves or other transition features, the regularity of the facets, curves or other transition features or other aspects may be determined. The number/shapes of transitions features in the homogenizer may be based on the shape of the entrance face and/or the exit face. For example, a number of facets may be based on a number of edges of the exit face, such as the number of facets may be a multiple of the number of edges of the exit face.

In S2050, it is determined if the light emitted from the exit face is within design criteria for the optical system. For example, it may be desired that the difference in the half angle of the light emitted from the exit face and the half angle of the light entering the homogenizer at the entrance face is less than 2%, and the peak to valley difference of flux per unit area of light emitted is less than 5% at the homogenizer exit face. Other design criteria may include the percent light in beam or percent conservation of radiance of an overall optical system incorporating the homogenizer.

In S2060, if the light emitted from the exit face of the homogenizer does not meet desired or required criteria, S2020, S2030, and/or S2040 may be iteratively modified. For example, the length of the homogenizer may be increased, the taper angle of the homogenizer may be increased and/or the number/shapes of transition features in the homogenizer may be changed.

Figure 20:
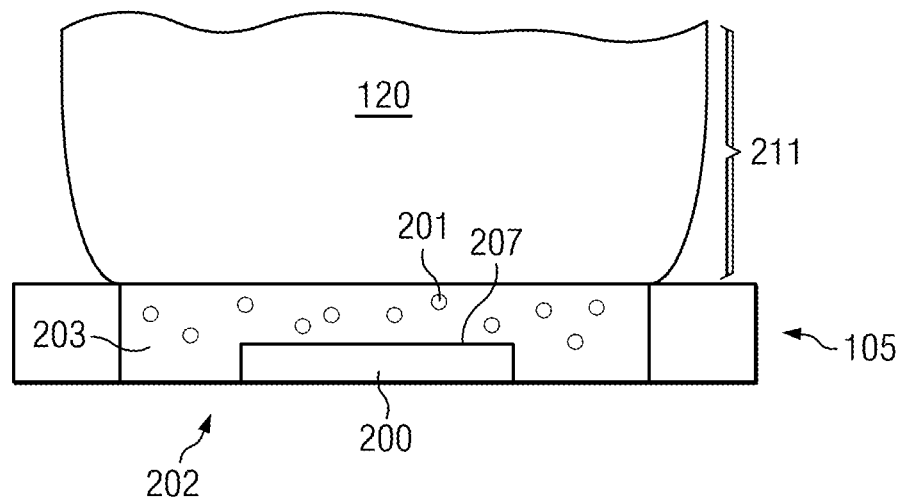
FIGS. 20 and 21 are diagrammatic representations of other embodiments of optical systems.
Figure 21:
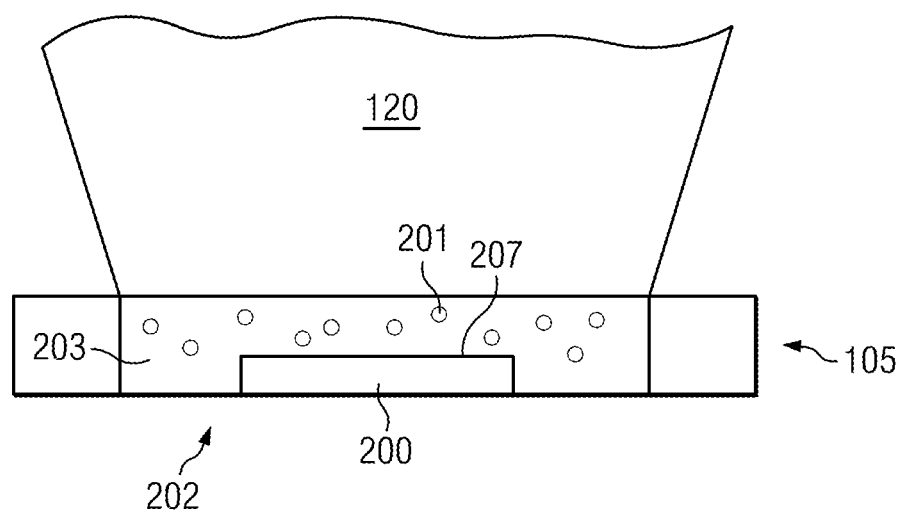

FIG. 20 is a diagrammatic representation of one embodiment of an optical system similar to that illustrated in FIG. 3, but indicating that homogenizer 120 can have a shaped section 211. According to one embodiment, shaped section 211 can have sidewalls shaped as described in U.S. Pat. No. 7,772,604 to prevent losses at the sidewalls. FIG. 21 is a diagrammatic representation of another embodiment of an optical system similar to that illustrated in FIG. 3, illustrating that the homogenizer 120 can have tapered sidewalls.

Those skilled in the arts will appreciate after reading this disclosure that dimensions and other data provided herein are exemplary and that embodiments disclosed herein may be manufactured according to other dimensions or data without limiting the scope of the disclosure.

Although embodiments have been described in detail herein, it should be understood that the description is by way of example only and is not to be construed in a limiting sense. It is to be further understood, therefore, that numerous changes in the details of the embodiments and additional embodiments will be apparent, and may be made by, persons of ordinary skill in the art having reference to this description. It is contemplated that all such changes and additional embodiments are within scope of the disclosure and its legal equivalents.

What is claimed is:

1. An optical system comprising:
   a homogenizer configured to emit light that has a half angle that is at least 80% of a half angle of light entering the homogenizer, the homogenizer comprising:
   an entrance face positioned to receive light from a source, the entrance face having a first shape;
   a body configured to homogenize light received through the entrance face by reflecting the light a plurality of times off sidewalls of the body; and
   an exit face configured to emit light, the exit face parallel to the entrance face; and
   an imaging high numerical aperture optical system coupled to the exit face of the homogenizer.

2. The system of claim 1, wherein the entrance face and exit face have approximately a same area.

3. The system of claim 1, wherein the exit face has an area at least equal to $$\frac{n^2 A\Omega}{n'^2 \Omega'}$$

wherein $\Omega$ is an effective solid angle in which light enters the homogenizer, $\Omega'$ is the effective solid angle whereby light leaves the homogenizer, A is the area of the entrance face, n is a refractive index of a medium from which light is received by the homogenizer, n' is a refractive index of material into which the homogenizer emits.

4. The system of claim 1, wherein the exit face has an area at least equal to $$\frac{n^2 A\pi}{n'^2 \Omega'}$$

wherein 106' is an effective solid angle whereby light leaves the homogenizer, A is the area of the entrance face, n is a refractive index of a medium from which light is received by the homogenizer, n' is a refractive index of a material into which the homogenizer emits.

5. The system of claim 1, wherein the body is tapered outward from the entrance face.

6. The system of claim 5, wherein the exit face has a second shape different than the first shape and the homogenizer comprises a set of transition features transitioning from the first shape to the second shape.

7. The system of claim 6, wherein the transition features comprise a set of sidewall facets transitioning to the second shape.

8. The system of claim 7, wherein the second shape has a surface area greater than or equal to a surface area of the first shape.

9. The system of claim 7, wherein the set of sidewall facets comprises a first set of facets corresponding to an extruded cut of the first shape, the cut tapering outward according to a first taper angle.

10. The system of claim 9, wherein the set of sidewall facets comprise a second set of facets corresponding to an extruded cut of a third shape tapering outward according to a second taper angle.

11. The system of claim 1, wherein the homogenizer is formed of at least one of plastic, PMMI, glass and silicone.

12. The system of claim 1, wherein the high numerical aperture optical system comprises an imaging multi-element optical stack comprising a series of lenses optically coupled to the exit face of the homogenizer, wherein a first lens of the series of lenses is directly coupled to the exit face of the homogenizer, the lenses in the series of lenses configured, in combination, to successively reduce a beam angle of light from a first beam angle to an emission beam angle and emit in an emission beam angle at least 70% of the light entering the series of lenses from the homogenizer.

13. The system of claim 1, wherein the imaging high numerical aperture optical system comprises an optical device configured to emit at least 70% of the light entering the optical device from the homogenizer in a controlled beam angle.

14. The system of claim 1, further comprising an encapsulant contacting the entrance face and wherein the imaging high numerical optical aperture system comprises a lens having a same index of refraction as the encapsulant.

15. The system of claim 1, wherein the exit face is a virtual exit face.

16. The system of claim 1, wherein the exit face is physical exit face.

17. A method of homogenizing light, comprising:
receiving light at an entrance face of a homogenizer, the entrance face having a first shape;
homogenizing light received through the entrance face by reflecting the light a plurality of times in the homogenizer; and
emitting homogenized light from an exit face of the homogenizer that is parallel to the entrance face of the homogenizer, the light emitted with a half angle that is at least 80% of the half angle of light entering the homogenizer into an imaging high numerical aperture system coupled to the exit face of the homogenizer.

18. The method of claim 17, wherein light is emitted from the exit face in a second shape different than the first shape.

19. The method of claim 17, wherein the high numerical aperture imaging system comprises a series of lenses that are configured, in combination, to successively reduce a beam angle of light from a first beam angle to an emission beam angle and emit in an emission beam angle at least 70% of the light entering the series of lenses from the homogenizer.

20. The method of claim 17, wherein the high numerical aperture imaging system is configured to emit in a controlled beam angle at least 70% of the light received from the homogenizer.

21. The method of claim 17, wherein:
the exit face has a second shape; and
the homogenizer further comprises:
a first set of sidewall facets corresponding to the first shape tapered outward at a first taper angle relative to an axis running from the entrance face to the exit face; and
a second set of sidewall facets corresponding to a third shape, the second set of facets tapered outward at a second taper angle relative to the axis.

22. The method of claim 21, wherein the entrance face is square and the exit face is circular.

* * * * *